(12) United States Patent
Huber et al.

(10) Patent No.: US 11,777,413 B2
(45) Date of Patent: Oct. 3, 2023

(54) SIGMA, DELTA AND SIGMA-DELTA DC/DC CONVERTERS FOR WIDE INPUT AND OUTPUT VOLTAGE RANGES

(71) Applicant: DELTA ELECTRONICS, INC., Neihu (TW)

(72) Inventors: Laszlo Huber, Cary, NC (US); Tomas Sadilek, Durham, NC (US); Misha Kumar, Cary, NC (US); Zhiyu Shen, Cary, NC (US); Jinfa Zhang, Shanghai (CN); Chia-Hsiong Huang, Taoyuan (TW); Peter Mantovanelli Barbosa, Durham, NC (US)

(73) Assignee: DELTA ELECTRONICS, INC., Neihu (TW)

( * ) Notice: Subject to any disclaimer, the term of this patent is extended or adjusted under 35 U.S.C. 154(b) by 4 days.

(21) Appl. No.: 17/346,681

(22) Filed: Jun. 14, 2021

(65) Prior Publication Data
US 2022/0149744 A1    May 12, 2022

Related U.S. Application Data

(60) Provisional application No. 63/111,346, filed on Nov. 9, 2020.

(51) Int. Cl.
| | |
|---|---|
| *H02M 3/335* | (2006.01) |
| *H02M 3/158* | (2006.01) |
| *H03M 3/00* | (2006.01) |
| *H02M 1/00* | (2006.01) |
| *H02M 1/08* | (2006.01) |

(52) U.S. Cl.
CPC ..... *H02M 3/33584* (2013.01); *H02M 1/0095* (2021.05); *H02M 1/08* (2013.01); *H03M 3/39* (2013.01); *H02M 3/1584* (2013.01); *H02M 3/33523* (2013.01)

(58) Field of Classification Search
CPC ... H02M 3/1584; H02M 3/33523; H02J 1/102
See application file for complete search history.

(56) References Cited

U.S. PATENT DOCUMENTS

| | | | |
|---|---|---|---|
| 5,321,600 A * | 6/1994 | Fierheller | H02M 1/4216 363/81 |
| 8,467,199 B2 | 6/2013 | Lee et al. | |
| 10,737,586 B2 | 8/2020 | Alves et al. | |
| 10,756,624 B2 | 8/2020 | Mauri | |
| 2009/0206804 A1* | 8/2009 | Xu | H02M 3/1584 323/234 |
| 2011/0316514 A1* | 12/2011 | Deboy | G05F 1/46 323/312 |

(Continued)

*Primary Examiner* — Gary A Nash
(74) *Attorney, Agent, or Firm* — Edward C. Kwok; VLP Law Group LLP

(57) ABSTRACT

A DC/DC converter may be formed out of the combination of a first converter that is optimized to transfer energy from a voltage source to a load, and a second converter that receives a control signal derived from the load voltage to regulate the load voltage. The DC/DC converter may be configured as a sigma converter, a delta converter, or a sigma-delta converter. The mode of operation being selected according to the source voltage or the load voltage, either of which may vary over a wide range.

52 Claims, 34 Drawing Sheets

(56) References Cited

U.S. PATENT DOCUMENTS

| | | | |
|---|---|---|---|
| 2014/0049990 A1* | 2/2014 | Limpaecher | H02M 3/33584 363/15 |
| 2014/0376268 A1* | 12/2014 | Manthe | H02M 3/285 363/17 |
| 2017/0214330 A1* | 7/2017 | Yang | H02M 3/01 |
| 2018/0138815 A1* | 5/2018 | Yamada | H02M 3/285 |
| 2018/0183347 A1 | 6/2018 | Ye et al. | |
| 2019/0181755 A1* | 6/2019 | Swamy | H02M 3/1584 |

\* cited by examiner

SIGMA, DELTA AND SIGMA-DELTA DC/DC CONVERTERS FOR WIDE INPUT AND OUTPUT VOLTAGE RANGES

CROSS REFERENCE TO RELATED APPLICATIONS

The present application relates to and claims priority of U.S. provisional patent application ("Provisional Application"), Ser. No. 63/111,346, entitled "SIGMA/DELTA TYPE DC/DC CONVERTERS FOR WIDE INPUT AND OUTPUT RANGES," filed Nov. 9, 2020. The disclosure of the Provisional Application is hereby incorporated by reference in its entirety.

BACKGROUND OF THE INVENTION

1, Field of the Invention

The present invention relates to DC/DC converters that maintain high efficiency over wide input and output voltage ranges. In particular, the present invention relates to sigma and delta topologies in DC/DC converters that maintain high efficiency over wide input and output voltage ranges.

2. DISCUSSION OF THE RELATED ART

In both high-voltage and low-voltage applications, LLC resonant DC/DC converters ("LLC converters") are highly efficient when operating with zero-voltage switching (ZVS) in the primary-side switches and zero-current switching (ZCS) in the secondary-side rectifiers over the entire input-voltage, output-voltage, and load-current ranges. An LLC converter achieves its highest efficiency when operating at its series resonant frequency. Due to the significantly reduced switching losses, the LLC converter achieves increased power density in high switching frequency operations. Under variable input and output voltages, the LLC converter typically operates with a variable switching frequency. As the input voltage range or the output voltage range increases (e.g., in applications with a hold-up time requirement, such as in servers for data centers and networking computers, high-voltage photovoltaic (PV) string applications, and on-board charger applications), the switching frequency range also increases, which reduces to converter efficiency.

The following approaches allow a switching-frequency range in an application with a wide input voltage range or a wide output voltage range to be considerably reduced:
  a. By controlling the output voltage of the LLC converter using a combination of variable-frequency feedback control techniques and open-loop delay-time (e.g., phase shift) control techniques. This approach applies variable-frequency control to the primary-side switches and applies delay-time control to the secondary-side synchronous rectifiers. Under that approach, when the delay-time control increases the energy in the resonant tank, the LLC converter exhibits boost characteristics (i.e., the delay-time control increases the voltage gain of the LLC converter). Examples of this approach are disclosed in: (1) U.S. Pat. No. 9,490,704 to Jang et al., entitled "System and method for controlling secondary-side switches in resonant power converters," issued on Nov. 8, 2016; (2) the article, entitled "Series resonant converter with reduced frequency-range control," by Jang et al., published in Proc. IEEE Applied Power Electron. Conf. (APEC), 2015, pp. 1453-1460; and (3) the article, entitled "A new LLC series resonant converter with a narrow switching frequency variation and reduced conduction losses," by J. W Kim et al., published in IEEE Trans. Power Electron., vol. 29, no. 8, August 2014, pp. 4278-4287.
  b. By adding an auxiliary DC/DC converter to the LLC converter. Under this approach, the LLC converter and the auxiliary DC/DC converter may be connected in a suitable sigma or delta topology. The LLC converter ("LLC DCX") is highly efficient when operating at an optimal operating point, such as (i) constant switching frequency (i.e., at its series resonant frequency), and (ii) at a constant duty cycle (e.g., ~50%). Under this approach, the LLC DCX typically delivers most—if not all—of the output power, while the auxiliary DC/DC converter regulates the output voltage, delivering little output power.

The LLC DCX in the sigma topology was first designed for voltage regulator modules (VRMs) in server power supplies. Examples of LLC DCXs in the sigma topology are disclosed in: (a) the article, entitled "High-efficiency quasi-parallel voltage Regulator," by J. Sun et al., published in Proc. IEEE Applied Power Electronics Conf. (APEC), 2008, pp. 811-817; (b) U.S. Pat. No. 7,872,866 to M. Xu et al., entitled "Quasi-parallel voltage regulator," issued on Jan. 18, 2011; (c) the article, entitled "High-efficiency high-power density 48/1 V sigma converter voltage regulator module" ("Ahmed"), by M. Ahmed et al., published in Proc. IEEE Applied Power Electronics Conf. (APEC), 2017, pp. 2207-2212.

Ahmed discloses a converter in the sigma topology ("sigma converter"), which includes an unregulated LLC DCX and a regulated non-isolated auxiliary DC/DC converter. FIG. 1 shows a block diagram of Ahmed's sigma converter (i.e., sigma converter 100). As shown in FIG. 1, in sigma converter 100, input signals $V_{IN,DCX}$ and $V_{IN,AUX}$ to LLC DCX 101 and the auxiliary DC/DC converter 102 are provided by the voltages across series-connected capacitors $C_{DCX}$ and $C_{AUX}$, respectively, such that their sum $V_{IN,DCX} + V_{IN,AUX}$ equals source voltage $V_{INT}$. The output signals of LLC DCX 101 and auxiliary DC/DC converter 102 are, however, provided as parallel connections across capacitor Co. LLC DCX 101, which delivers most of the output power, operates with ZVS in the primary-side switches and ZCS in the secondary-side synchronous rectifiers and, therefore, has very high efficiency. Auxiliary DC/DC converter 102 may be implemented as a buck converter with pulse-width modulation (PWM) to regulate output voltage $V_O$, even though it delivers only a small portion of the output power. Therefore, sigma converter 100 has a very high efficiency. FIG. 2 shows circuit 200 which implements sigma converter 100 of FIG. 1.

A converter in the delta topology ("delta converter") was first disclosed as an intermediate bus converter that is used in a telecom power supply circuit. Examples of a delta converter are disclosed in (i) the article "A MHz regulated DC transformer with wide voltage range," by T. Liu et al., published in the Proc. IEEE Int'l Power Electron. and Appl. Conf. (PEAC), 2018, pp. 794-797; and (ii) the article "1 MHz 48V-12V regulated DCX with single transformer," by T. Liu et al., published in the IEEE Journal of Emerging and Selected Topics in Power Electronics, vol. 9, Issue 1, February 2021. Like the sigma converter, the delta converter may consist of an unregulated LLC DCX converter and a regulated auxiliary DC/DC converter.

FIG. 3 shows delta converter 300 in the prior art. Unlike auxiliary DC/DC converter 102 of sigma converter 100, which provides output voltage $V_O$ at the load, auxiliary DC/DC converter 302 receives an input signal from an auxiliary output port of LLC DCX 301. Input signal $V_{IN,DCX}$ of LLC DCX 301 (also represented by capacitor $C_{DCX}$) is provided by the series-connected voltage source $V_{IN}$ and capacitor $C_{AUX}$ (i.e., input voltage $V_{IN,DCX}$ of LLC DCX 301 equals the sum of source voltage $V_{IN}$ and output signal $V_{O,AUX}$ of auxiliary DC/DC converter 302). In other words, as implied by the name "delta converter," input source voltage $V_{IN}$ equals the voltage difference $V_{IN,DCX} - V_{O,AUX}$. In delta converter 300, LLC DCX 301 delivers both the power to the load and the input power of auxiliary DC/DC converter 302. Auxiliary DC/DC converter 302 may be a non-isolated DC/DC converter (e.g., a buck converter) operating under PWM modulation to regulate the load voltage. The power handled by auxiliary DC/DC converter 302 is only a small fraction of the load power. Therefore, delta converter 300 also has very high efficiency. FIG. 4 shows circuit 400, which implements exemplary delta converter 300 of FIG. 3. In delta converter 300, such as implemented by circuit 400 of FIG. 4, source voltage $V_{IN}$ is floating (i.e., it is not connected to the primary-side ground).

SUMMARY

The present invention relates to DC/DC converters that operate over wide input and output voltage ranges, such as DC/DC converters in applications with a hold-up time requirement (e.g., servers in data centers and networking computers), in high-voltage PV string applications, on-board chargers with wide input and output voltage ranges, or in any high power density application that requires high efficiency at high switching frequencies.

The present invention is applicable to DC/DC converters having sigma topologies ("sigma converters"), delta topologies ("delta converters"), or combined sigma-delta topologies ("sigma-delta converters"). A sigma converter, delta converter, or sigma-delta converter of the present invention may be a combination of two component DC/DC converters: (i) an unregulated converter (e.g., an LLC converter, a series resonant converter (SRC), or a dual-active-bridge (DAB) converter) that operates at an optimal operating point with constant switching frequency and constant duty cycle (e.g., ~50% duty cycle); and (ii) an auxiliary converter with a regulated output voltage. In some embodiments, the auxiliary converter may have a lower efficiency than the unregulated converter. To achieve high efficiency, the unregulated converter may operate under ZVS conditions in its primary-side switches and under ZCS conditions in its secondary-side rectifiers. The unregulated converter may deliver most—if not all—of the output power. The unregulated converter may operate in open-loop and over a switching frequency that is higher than, but independent of, the switching frequencies of the auxiliary converter.

The sigma topology in a sigma converter of the present invention may reside on either the voltage-source side (i.e., an "input sigma converter") or on the load side (i.e., an "output sigma converter"). In an input sigma converter, the sum of the input voltages of the component DC/DC converters equals the source voltage. In an output sigma converter, the sum of the output voltages of the component DC/DC converters equals the load voltage. The delta topology in a delta converter of the present invention is implemented on the voltage-source side.

The output sigma converters and the delta converters of the present invention may have their highest efficiency at maximum source voltage, decreasing in efficiency slightly with decreasing source voltage. The input sigma converters of the present invention, however, may have their highest efficiency at minimum source voltage, decreasing in efficiency slightly with increasing source voltages. The sigma-delta converters of the present invention may achieve a more balanced efficiency over the entire source voltage range, relative to the efficiencies of the sigma or delta converters.

The present invention is better understood upon consideration of the detailed description below in conjunction with the accompanying drawings.

DETAILED DESCRIPTION OF THE PREFERRED EMBODIMENTS

A DC/DC converter of the present invention includes two component DC/DC converters: (i) an unregulated DC/DC converter, and (ii) a DC/DC converter that regulates the output voltage. In this detailed description, the unregulated DC/DC converter is referred to as the "DCX converter," and the DC/DC converter that regulates the output voltage is referred to as the "auxiliary DC/DC converter." As illustrated in this detailed description, the present invention is especially beneficial to applications with wide input or output voltage ranges. For example, in a computer application with a hold-up time requirement (e.g., a server in a date center or a network computer), source voltage $V_{IN}$ to the DC/DC converter may be an output voltage from a power factor correction (PFC) circuit. In that application, input voltage $V_{IN}$ may be nominally, for example, 380±20 V, but may vary between 200-400 V during exceptional events. For data integrity, it is important to maintain output voltage $V_O$ at the load to be held substantially constant (e.g., at 48±5 V), for example, during an orderly shut-down procedure (e.g., for a duration of 10-100 milliseconds). In the examples below, it is desirable that the DCX converter is primarily responsible for delivering substantially all power to the load, while the auxiliary DC/DC converter maintains output voltage $V_O$ stable. For that purpose, the DCX converter may operate at 2 kW, while the auxiliary DC/DC converter may operate at 300 W. The DCX converter preferably includes an isolating transformer that has a turns-ratio that substantially determines its relatively constant gain.

Figure 1:
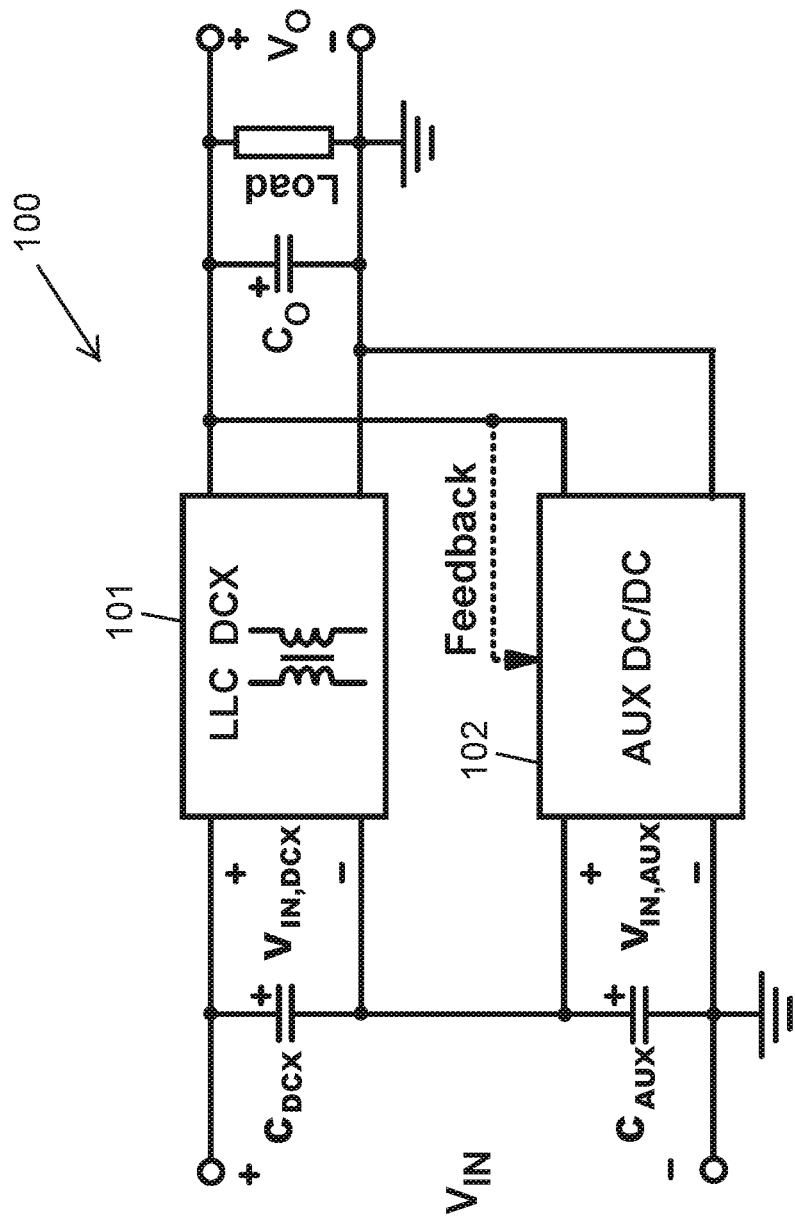
FIG. 1 shows a block diagram of prior art sigma converter 100.
Figure 2:
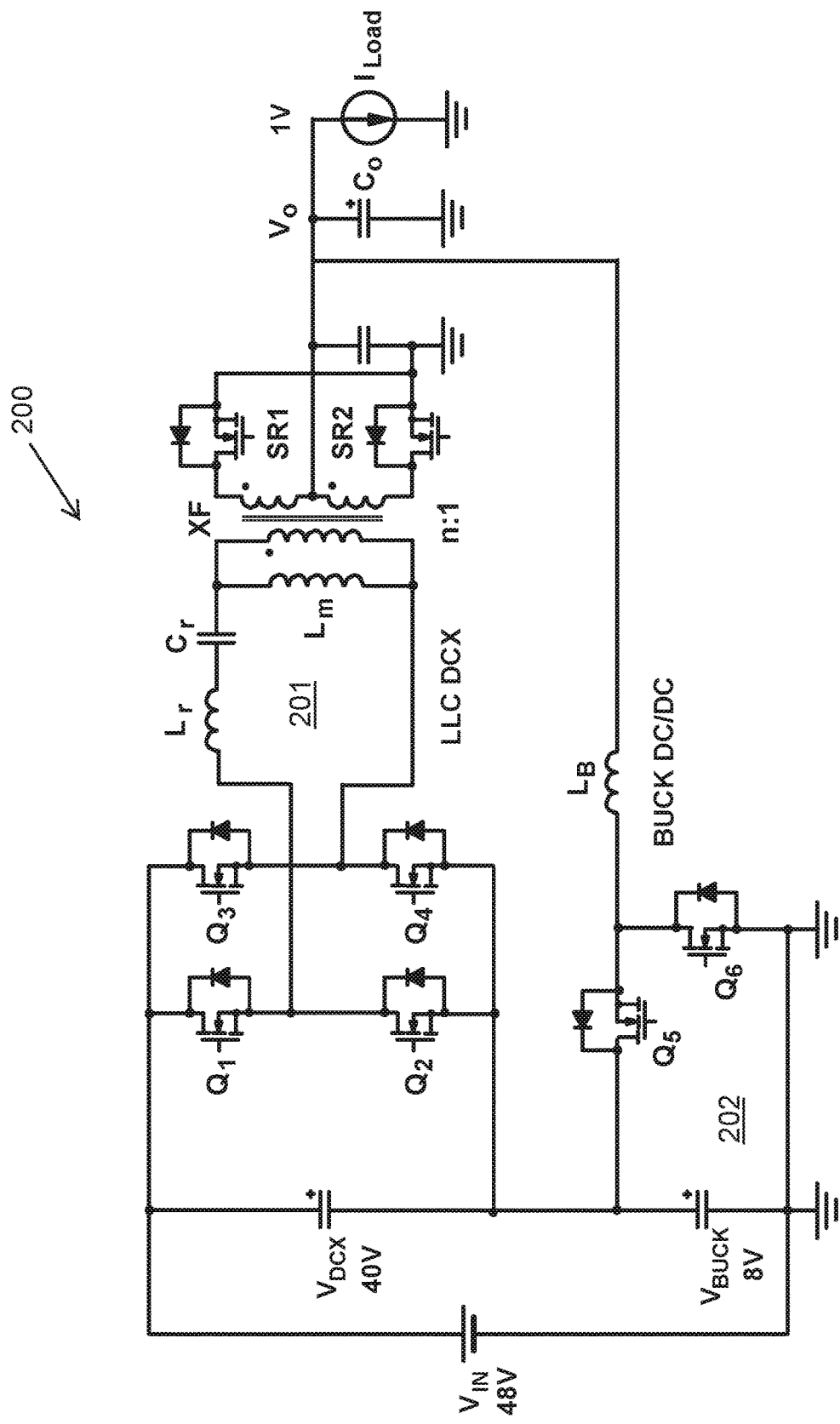
FIG. 2 shows circuit 200, which implements prior art sigma converter 100 of FIG. 1.
Figure 3:
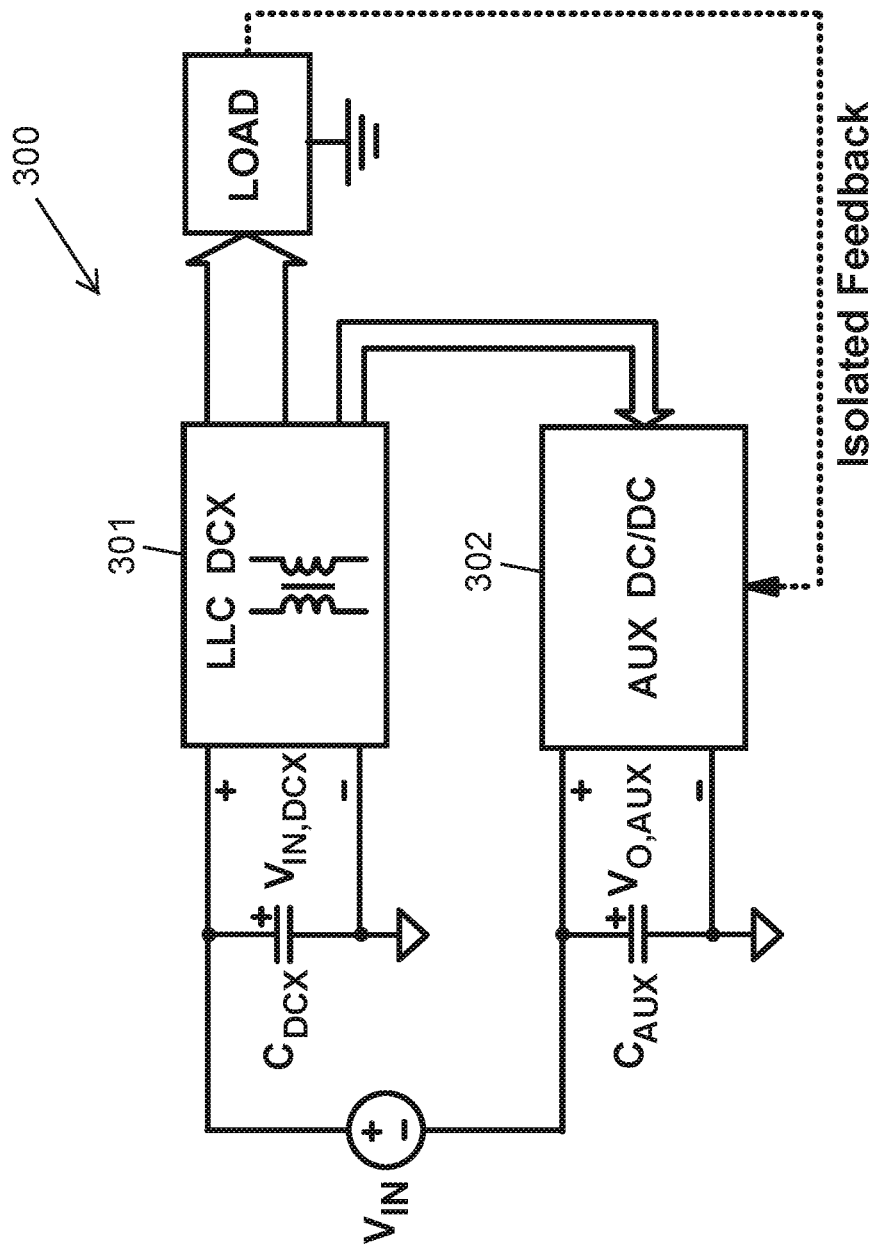
FIG. 3 shows a block diagram of prior art delta converter 300.
Figure 4:
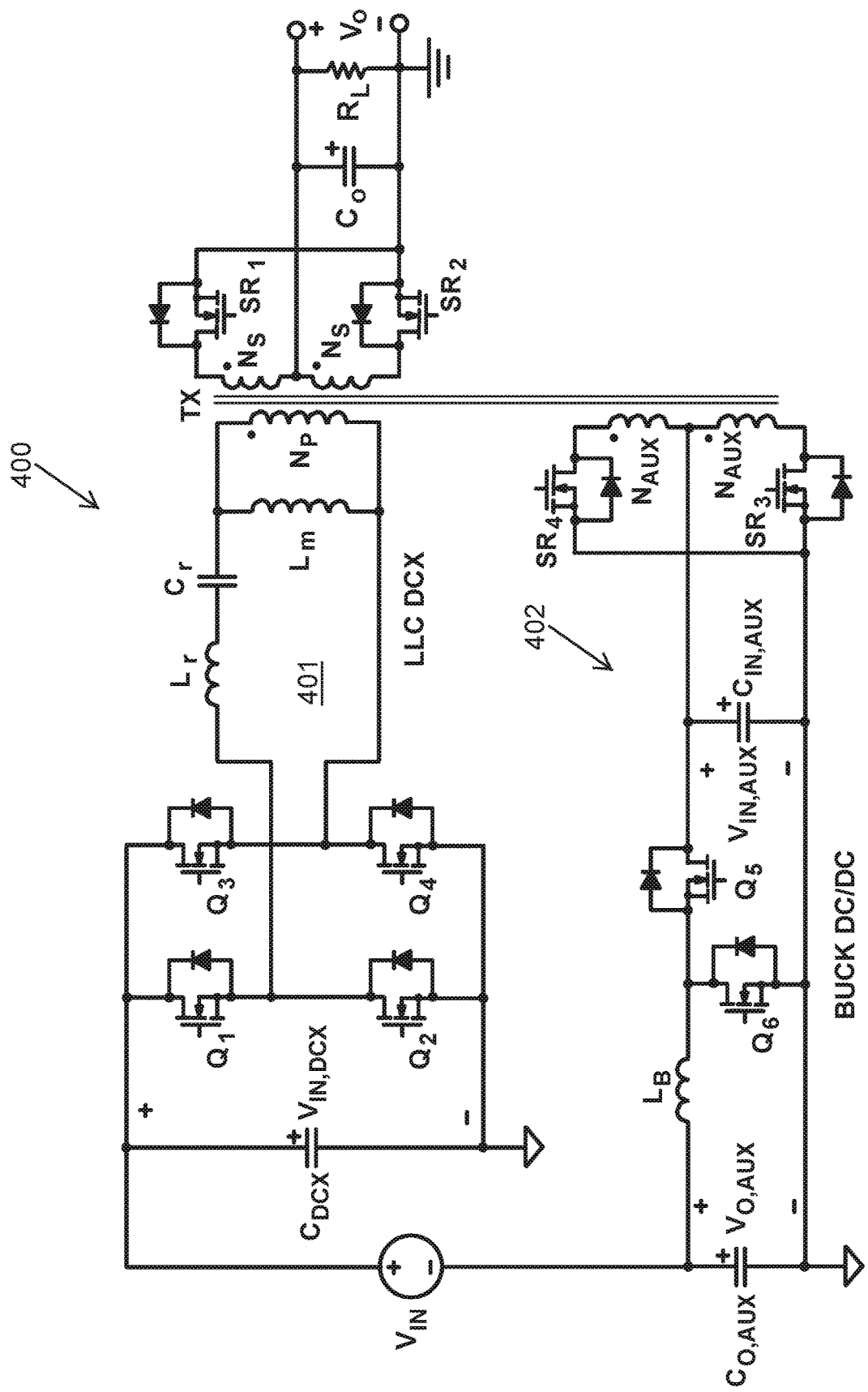
FIG. 4 shows circuit 400, which implements prior art delta converter 300 of FIG. 3.
Figure 5:
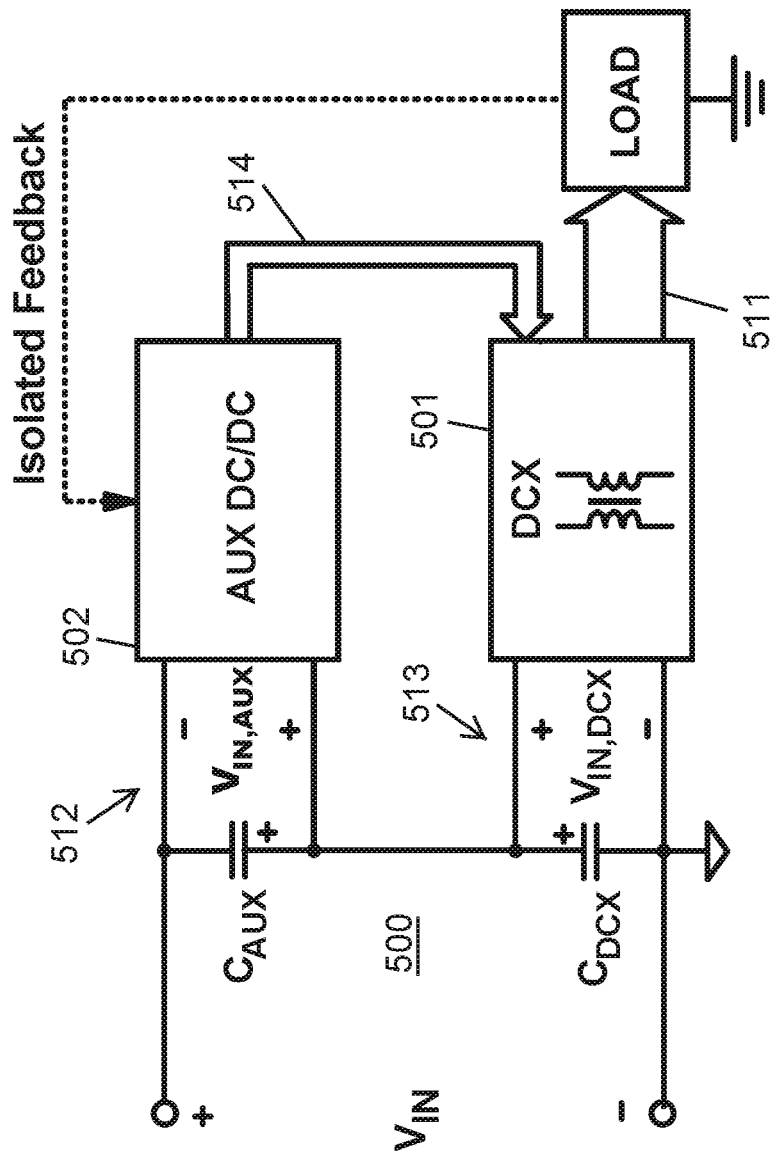
FIG. 5 shows a block diagram of input sigma converter 500, according to one embodiment of the present invention.

A sigma converter of the present invention may have its sigma topology implemented on either the voltage-source side (i.e., as an input sigma converter) or the load side (i.e., as an output sigma converter). FIG. 5 shows a block diagram of input sigma converter 500, according to one embodiment of the present invention. As shown in FIG. 5, input sigma converter 500 includes DCX converter 501, such as an LLC converter, a series resonant converter (SRC), or a dual-active-bridge (DAB) converter. Auxiliary DC/DC converter 502 may be a regulated non-isolated auxiliary DC/DC converter. As shown in FIG. 5, input ports 512 and 513 of DCX converter 501 and auxiliary DC/DC converter 502, represented by series-connected capacitors $C_{DCX}$ and $C_{AUX}$, respectively, are configured such that the sum $V_{IN,DCX}+V_{IN,AUX}$ of their input voltages $V_{IN,DCX}$ and $V_{IN,AUX}$ equals source voltage $V_{IN}$. In this configuration, as input voltage $V_{IN,DCX}$ to DCX converter 501 is substantially constant (and is lower than the minimum value of source voltage $V_{IN}$), input voltage $V_{IN,AUX}$ of auxiliary DC/DC converter 502 increases with source voltage $V_{IN}$, such that $V_{IN,AUX}=V_{IN}-V_{IN,DCX}$. DCX converter 501 has output ports 511 and 514. Output port 511 transfers power to the load, while output port 514, also referred to as "auxiliary output port" 514, is the common connections of the output ports of DCX converter 501 and auxiliary DC/DC converter 502. Auxiliary DC/DC converter 502 may be a non-isolated DC/DC converter (e.g., a buck converter, a boost converter, or a buck-boost converter) operated under PWM modulation to regulate voltage $V_O$ across the load. DCX converter 501 delivers substantially all the power to the load from power received at input port 513, even though a small portion of the load power may be delivered from input port 512 of auxiliary DC/DC converter 502 to output port 514. Since input ports 513 and 512 of DCX converter 501 and auxiliary DC/DC converter 502, respectively, are connected in series, power is distributed between DCX converter 501 and auxiliary DC/DC converter 502 according to the ratio of their respective input voltages, i.e., $P_{IN,DCX}/P_{IN,AUX}=V_{IN,DCX}/V_{IN,AUX}$, where $P_{IN,DCX}$ and $P_{IN,AUX}$ are the powers received respectively into DCX converter 501 and auxiliary DC/DC converter 502. Since input voltage $V_{IN,AUX}$ has its minimum value at a minimum value of source voltage $V_{IN}$ and input voltage $V_{IN,DCX}$ of DCX converter 501 is kept constant, input sigma converter 500 of FIG. 5 has its highest efficiency at the minimum value of source voltage $V_{IN}$.

Figure 6:
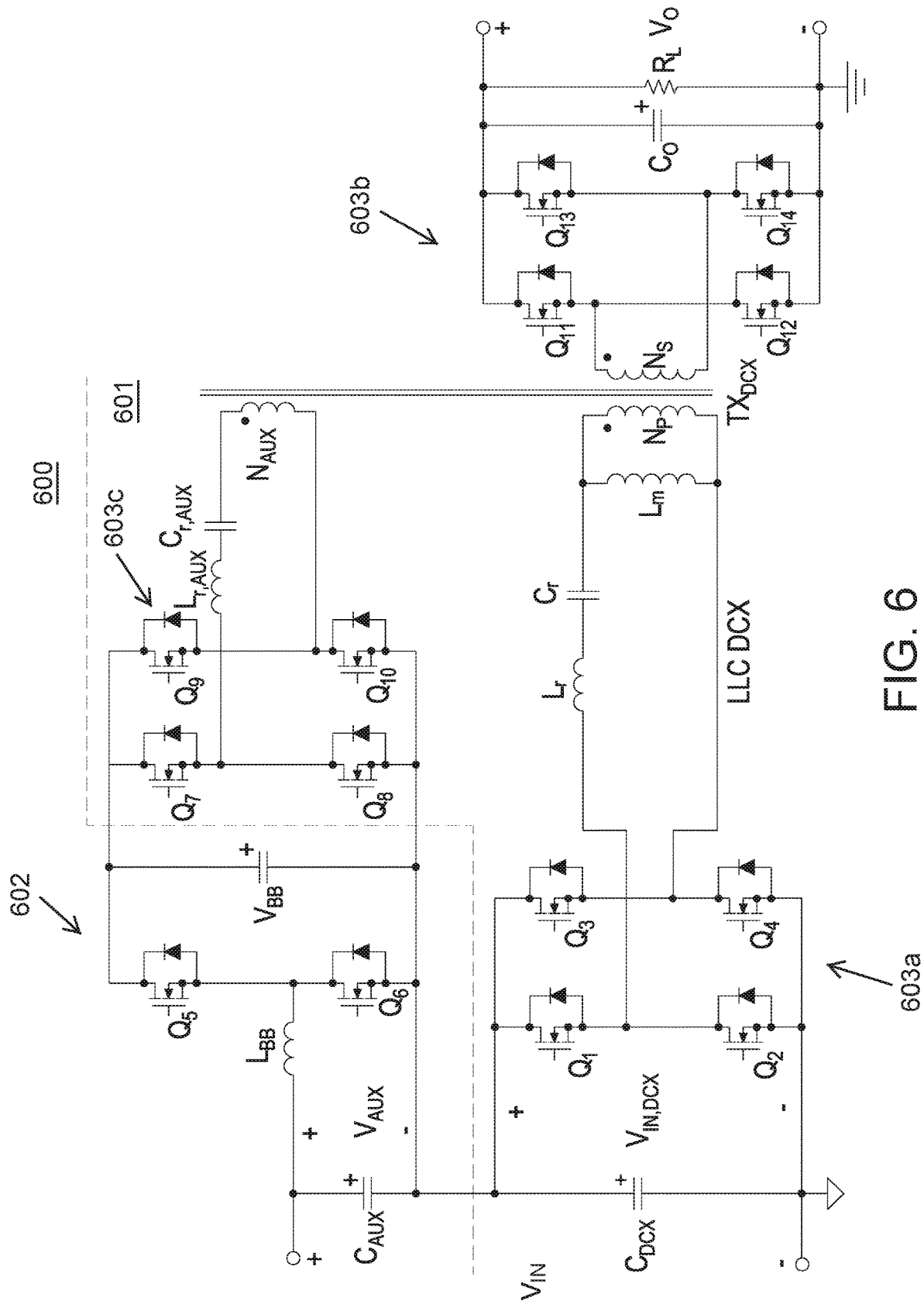
FIG. 6 shows exemplary circuit 600, which implements input sigma converter 500 of FIG. 5, according to one embodiment of the present invention.

FIG. 6 shows exemplary circuit 600, which implements input sigma converter 500 of FIG. 5, according to one embodiment of the present invention. In FIG. 6, DCX converter 501 is implemented by LLC DCX 601, which includes on the primary-side of transformer $TX_{DCX}$ input port 603a and, on the secondary side of transformer $TX_{DCX}$, secondary-side output port 603b and auxiliary output port 603c, each being provided a full-bridge topology. However, LLC DCX 601 can also be implemented with primary-side input port 603a, secondary-side output port 603b and auxiliary output port 603c each being provided a half-bridge topology. In addition, in LLC DCX 601, on the secondary side of transformer $TX_{DCX}$, each output port can also be implemented using a center-tapped secondary winding and two synchronous rectifiers. In FIG. 6, non-isolated auxiliary DC/DC converter 502 of FIG. 5 is implemented by boost converter 602. However, non-isolated auxiliary DC/DC converter 502 of FIG. 5 may also be implemented by a converter of another topology (e.g., a buck converter or a buck-boost converter).

Figure 7:
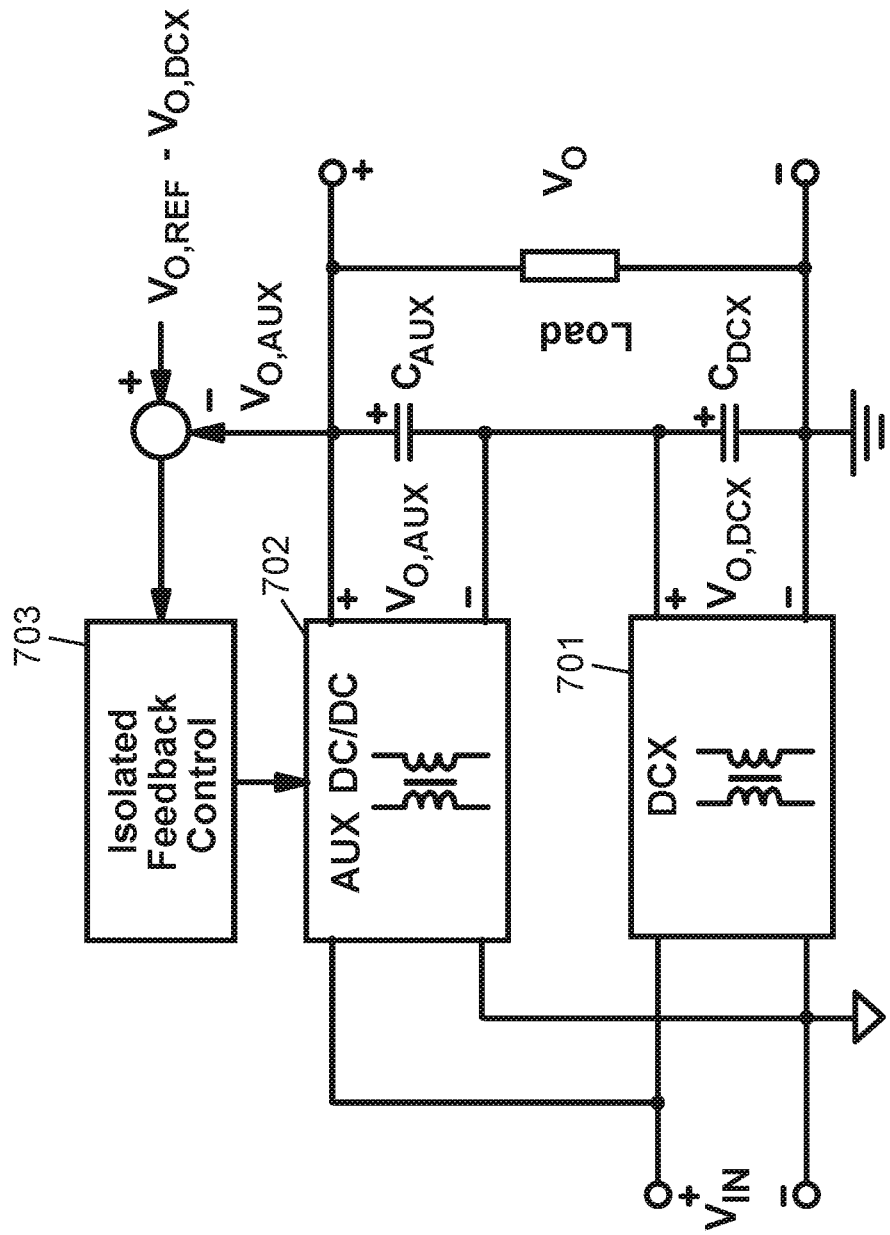
FIG. 7 shows a block diagram of output sigma converter 700, according to one embodiment the present invention.

FIG. 7 shows a block diagram of output sigma converter 700, according to one embodiment of the present invention.

Output sigma converter 700 includes (i) isolated DCX converter 701 (e.g., an LLC converter, a series resonant converter (SRC), or a dual-active-bridge (DAB) converter), and (ii) regulated, isolated auxiliary DC/DC converter 702. The output ports of DCX converter 701 and auxiliary DC/DC converter 702 are connected in series, such that voltage sum $V_{O,DCX}+V_{O,AUX}$ of their respective output voltages $V_{O,DCX}$ and $V_{O,AUX}$ equals output voltage $V_O$. The input ports of DCX converter 701 and auxiliary DC/DC converter 702 are connected in parallel at input voltage source $V_{IN}$. In DCX converter 701, the primary-side switches may operate under a ZVS condition and the secondary-side rectifiers may operate under a ZCS condition to achieve high efficiency. Auxiliary DC/DC converter 702 may operate under PWM modulation to regulate output voltage $V_O$. Although the efficiency of auxiliary DC/DC converter 701 is lower than the efficiency of DCX converter 701, DCX converter 701 delivers most of the output power to the load, while auxiliary DC/DC converter 702 delivers only a small portion of the output power to the load. As a result, output sigma converter 700 of FIG. 7 achieves very high efficiency. Since the voltage gain of the DCX converter 701 is substantially constant, its output voltage $V_{O,DCX}$—which is smaller than output voltage $V_O$—varies by an amount proportionally to the variations in input voltage $V_{IN}$. Consequently, output voltage $V_{O,AUX}$ of auxiliary DC/DC converter 702 decreases when input voltage $V_{INT}$ increases. Since the output ports of DCX converters 701 and auxiliary DC/DC converter 702 are connected in series, power is distributed between DCX converter 701 and auxiliary DC/DC converter 702 according to the ratio of their output voltages, i.e., $P_{O,DCX}/P_{O,AUX}=V_{O,DCX}/V_{O,AUX}$, where $P_{O,DCX}$ and $P_{O,AUX}$ are their respective powers transferred to the load. When input voltage $V_{IN}$ is at its maximum, output voltage $V_{O,DCX}$ has a maximum value and output voltage $V_{O,AUX}$ has a minimum value. Thus, output sigma converter 700 of FIG. 7 has its highest efficiency when input voltage $V_{IN}$ is at its maximum.

In some low-voltage applications, such as those in which the voltage-source ground and the load ground are not separated, auxiliary DC/DC converter 702 may be implemented by a non-isolated converter.

Figure 8:
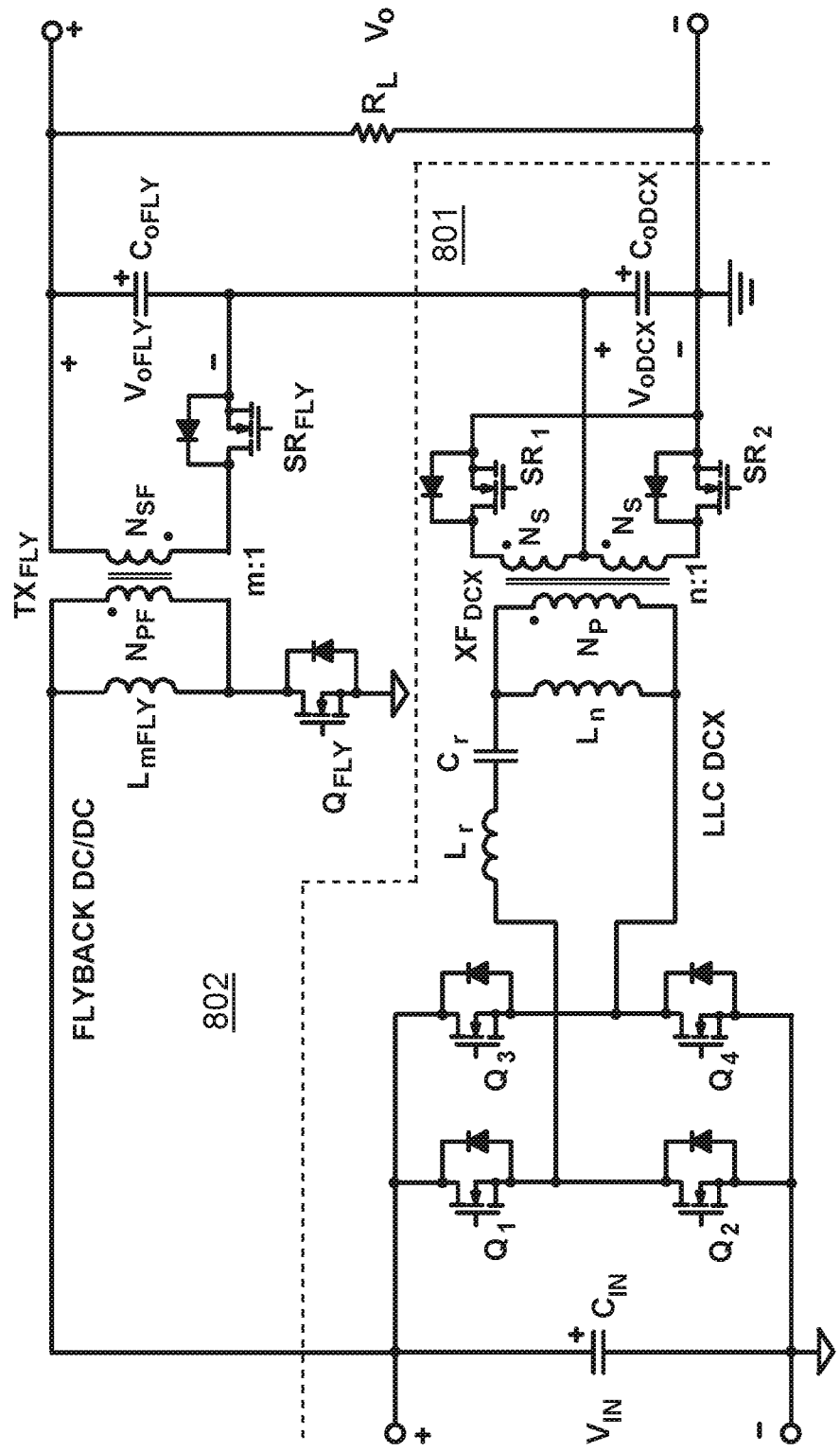
FIG. 8 shows exemplary circuit 800, which implements output sigma converter 700 of FIG. 7, according to one embodiment of the present invention.

FIG. 8 shows exemplary circuit 800, which implements output sigma converter 700 of FIG. 7, according to one embodiment of the present invention. In FIG. 8, DCX converter 701 is implemented by LLC DCX 801, which has a full-bridge topology on the primary side of transformer $XF_{DCX}$ and a center-tapped winding and two synchronous rectifiers on the secondary side of transformer $XF_{DCX}$. However, LLC DCX 801 can also be implemented using a half-bridge topology on the primary side of transformer $XF_{DCX}$ and, on the secondary side of transformer $XF_{DCX}$, the combination of a single secondary transformer winding and a full-bridge rectifier. Isolated auxiliary DC/DC converter 702 of FIG. 7 is implemented in FIG. 8 by flyback converter 802.

Figure 9:
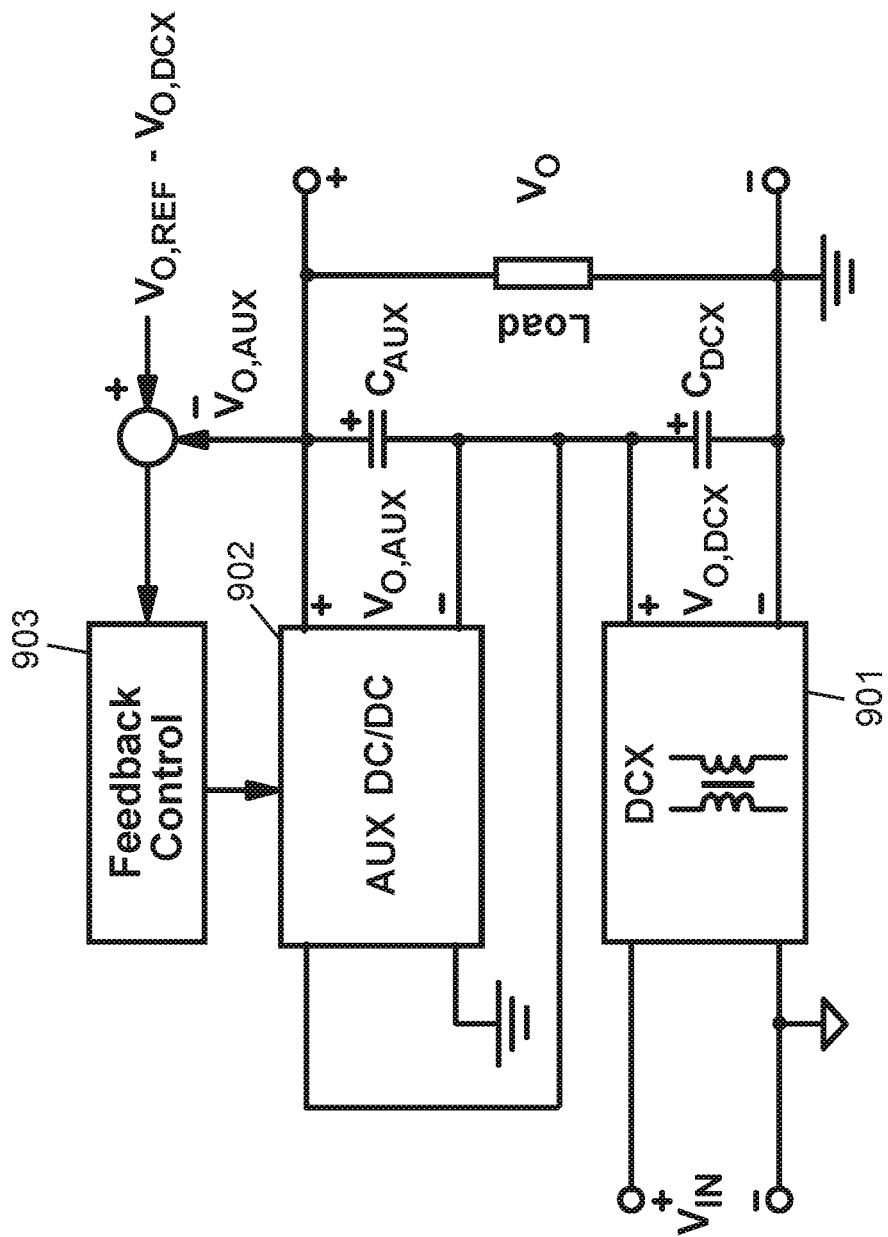
FIG. 9 shows a block diagram of output sigma converter 900, according to one embodiment of the present invention.

FIG. 9 shows a block diagram of output sigma converter 900, according to one embodiment of the present invention. Output sigma converter 900 of FIG. 9 includes (i) unregulated DCX converter 901 (e.g., an LLC converter, a series resonant converter (SRC), or a dual-active-bridge (DAB) converter), and (ii) regulated, non-isolated auxiliary DC/DC converter 902. The output ports of DCX converter 901 and auxiliary DC/DC converter 902 are connected in series, such that voltage sum $V_{O,DCX}+V_{O,AUX}$ of their respective output voltages $V_{O,DCX}$ and $V_{O,AUX}$ equals output voltage $V_O$. The input port of DCX converter 901 is connected to input voltage source $V_{IN}$, and the input port of auxiliary DC/DC converter 902 is connected to the output port of DCX converter 901. When DCX converter 901 includes isolation by a transformer, the primary-side switches of DCX converter 901 may operate under a ZVS condition and the secondary-side rectifiers may operate under a ZCS condition to achieve a very high efficiency. Auxiliary DC/DC converter 902 may operate under PWM modulation to regulate output voltage $V_O$. Although the efficiency of auxiliary DC/DC converter 902 is lower than the efficiency of DCX converter 901, the efficiency of output sigma converter 900 of FIG. 9 is very high. In fact, DCX converter 901 delivers most of the output power directly and only a small portion of the output power is delivered indirectly through auxiliary DC/DC converter 902. The voltage gain of DCX converter 901 is substantially constant, so that its output voltage $V_{O,DCX}$—which is smaller than output voltage $V_O$—varies by an amount proportionally to the variation in source voltage $V_{INT}$. Consequently, output voltage $V_{O,AUX}$ of auxiliary DC/DC converter 902 decreases when source voltage $V_{IN}$ increases. The output current of DCX converter 901 equals to the sum of the load current and the input current of auxiliary DC/DC converter 902, while the output current of auxiliary DC/DC converter 902 equals the load current. Therefore, power is distributed between DC/DC converters 901 and 902 according to the ratio of their respective output voltages $V_{O,DCX}$ and $V_{O,AUX}$, or more accurately, $P_{O,DCX}/P_{O,AUX}=V_{O,DCX}/V_{O,AUX}+1/\eta_{AUX}$, where $\eta_{AUX}$ is the efficiency of auxiliary DC/DC converter 902, and $P_{O,DCX}$ and $P_{O,AUX}$ being the respective power outputs of DCX converter 901 and auxiliary DC/DC converter 902. When source voltage $V_{IN}$ is at its maximum, output voltage $V_{O,DCX}$ of DCX converter 901 is at its maximum value and output voltage $V_{O,AUX}$ of auxiliary DC/DC converter 902 is at its minimum value. Thus, output sigma converter 900 of FIG. 9 has its highest efficiency when source voltage $V_{IN}$ is at its maximum.

Figure 10:
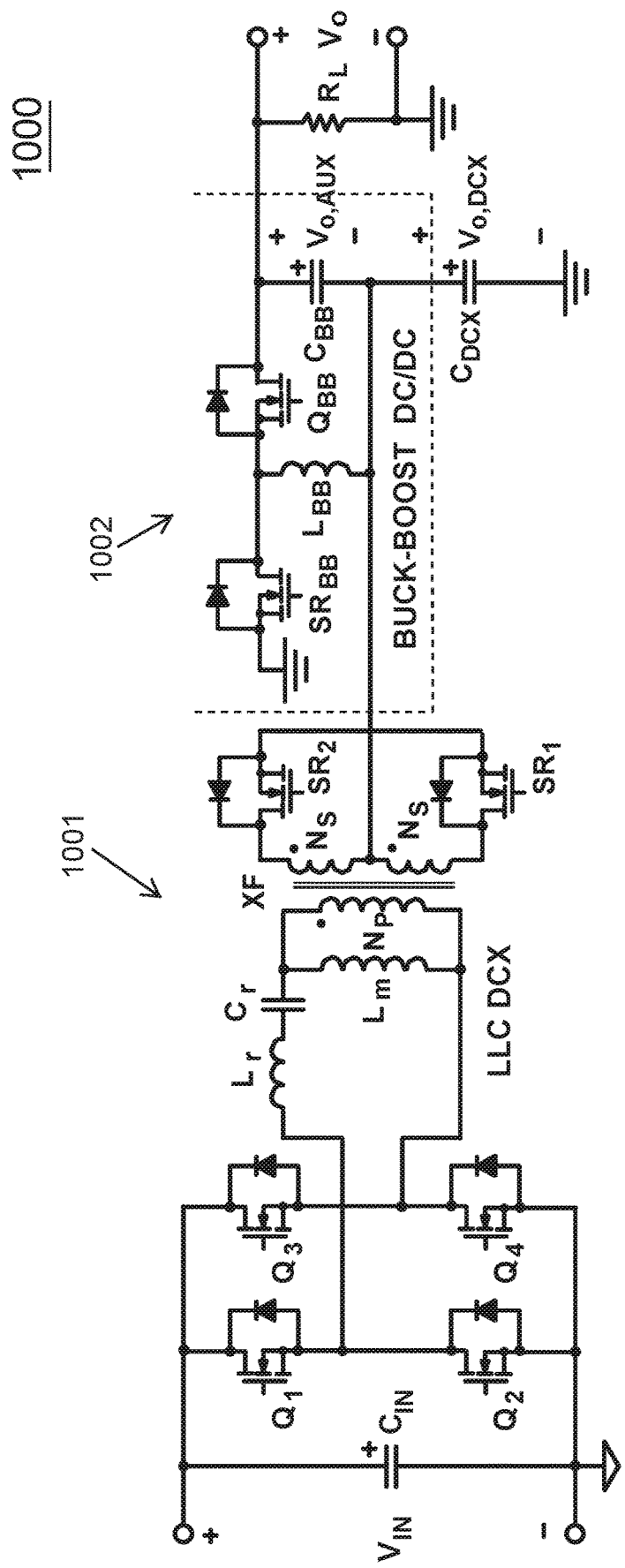
FIG. 10 shows exemplary circuit 1000, which implements output sigma converter 900 of FIG. 9, according to one embodiment of the present invention.

FIG. 10 shows exemplary circuit 1000, which implements output sigma converter 900 of FIG. 9, according to one embodiment of the present invention. In FIG. 10, DCX converter 901 is implemented by LLC DCX 1001 with a full-bridge topology on the primary side of transformer XF and, on the secondary side of transformer XF, a center-tapped winding and two synchronous rectifiers. Note that, LLC DCX 1001 can also be implemented with a half-bridge topology on the primary side of transformer XF and, on the secondary side of transformer TF, a single secondary winding and a full-bridge rectifier. Non-isolated auxiliary DC/DC converter 902 of FIG. 9 may be implemented by buck-boost converter 1002, as shown in FIG. 10.

Figure 11:
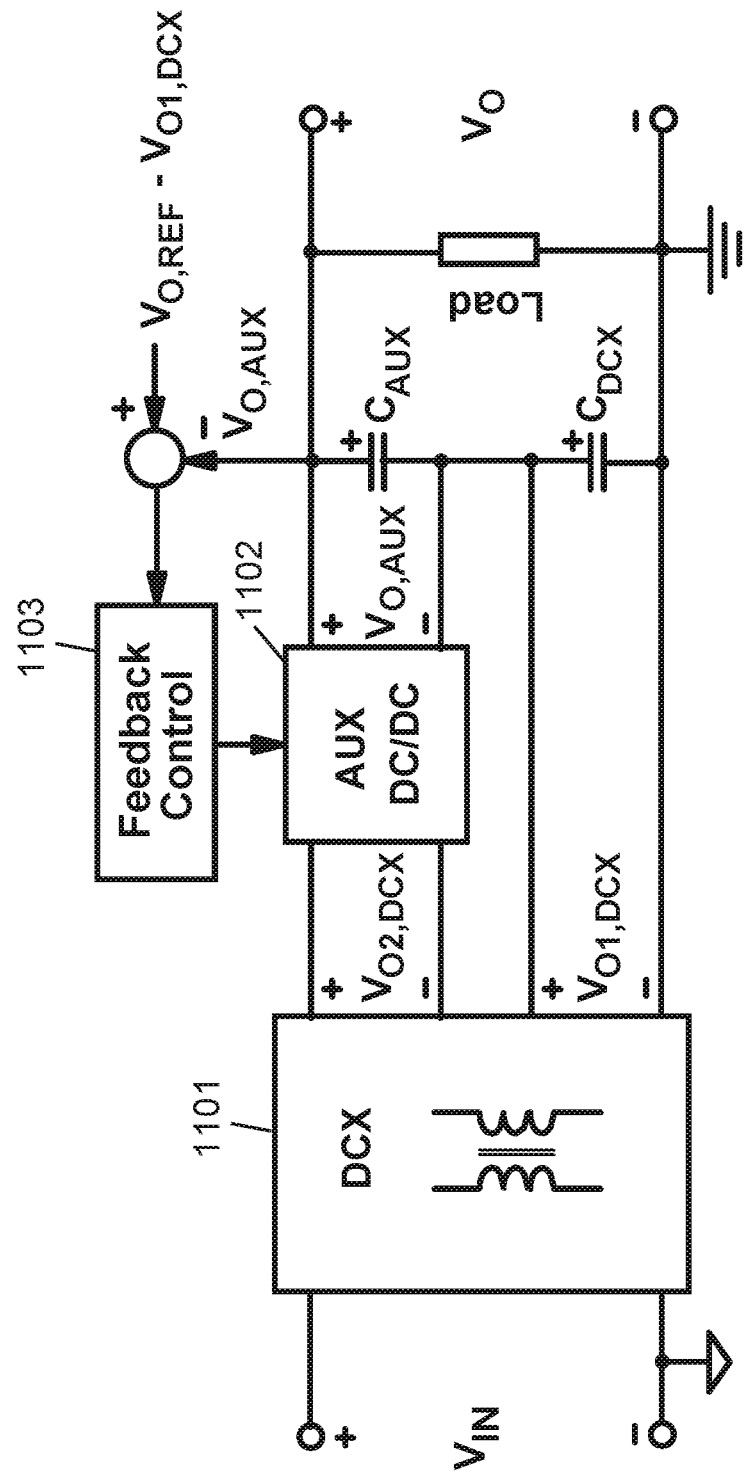
FIG. 11 shows a block diagram of output sigma converter 1100, according to one embodiment of the present invention.

FIG. 11 shows a block diagram of output sigma converter 1100, according to one embodiment of the present invention. Output sigma converter 1100 includes (i) unregulated DCX converter 1101 (e.g., an LLC converter, a series resonant converter (SRC), or a dual-active-bridge (DAB) converter), and (ii) regulated, non-isolated auxiliary DC/DC converter 1102. In output sigma converter 1100, auxiliary DC/DC converter 1102 is fed from a second output port of DCX converter 1101, thus allowing design optimization.

Figure 12:
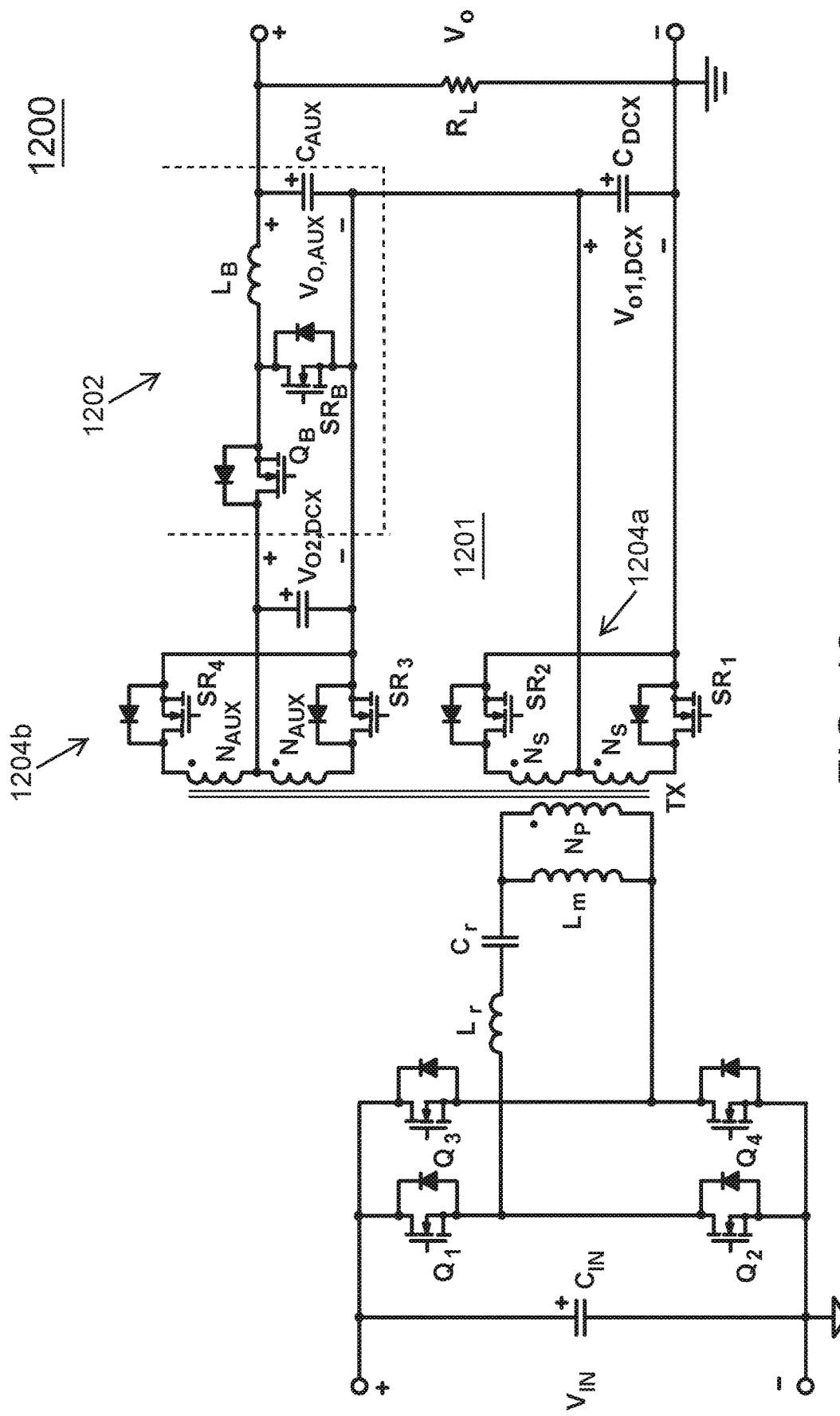
FIG. 12 shows exemplary circuit 1200, which implements output sigma converter 1100 of FIG. 11, according to one embodiment of the present invention.

FIG. 12 shows exemplary circuit 1200, which implements output sigma converter 1100 of FIG. 11, according to one embodiment of the present invention. In FIG. 12, DCX converter 1101 of FIG. 11 is implemented by LLC DCX 1201, which includes a full-bridge topology on the primary side of transformer TX and, on the secondary side of transformer TX, a center-tapped secondary winding and two synchronous rectifiers in each of output ports 1204a and 1204b. The primary side of transformer TX in LLC DCX 1101 can also be implemented with a half-bridge topology and, on the secondary side of transformer TX, with a single secondary winding and a full-bridge rectifier in each of output ports 1204a and 1204b. Non-isolated auxiliary DC/DC converter 1102 of FIG. 11 is implemented in FIG. 12 by buck converter 1202. Note that, non-isolated auxiliary DC/DC converter 1102 of FIG. 11 can also be implemented with another topology (e.g., a boost converter, or a non-inverting buck-boost converter).

Figure 13:
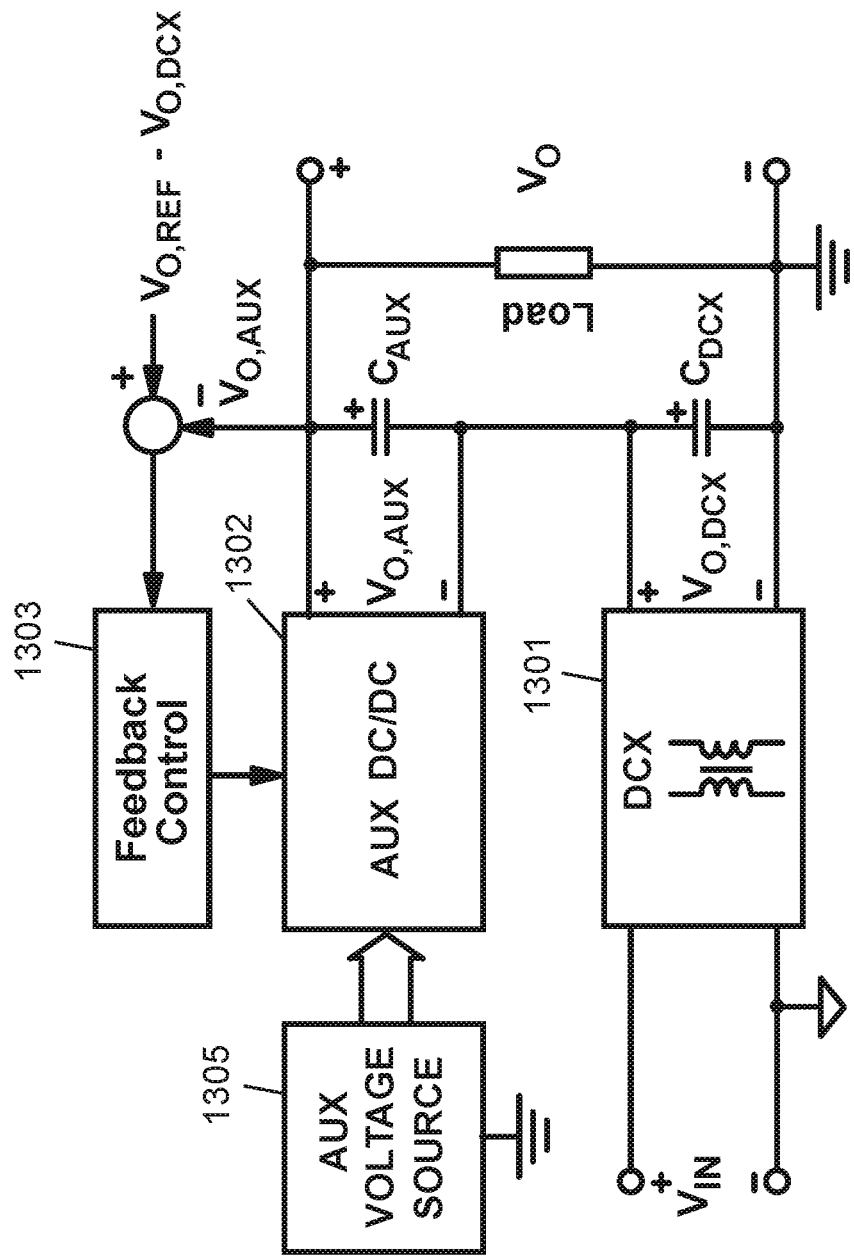
FIG. 13 shows a block diagram of output sigma converter 1300, according to another embodiment of the present invention.

FIG. 13 shows a block diagram of output sigma converter 1300, according to one embodiment of the present invention. Output sigma converter 1300 includes (i) unregulated DCX converter 1301 (e.g., an LLC converter, a series resonant converter (SRC), or a dual-active-bridge (DAB) converter), and (ii) regulated, non-isolated auxiliary DC/DC converter 1302. In output sigma converter 1300, auxiliary DC/DC converter 1302 may be fed from auxiliary voltage source 1305, for example, on the output (i.e., load) side of output sigma converter 1300.

Figure 14:
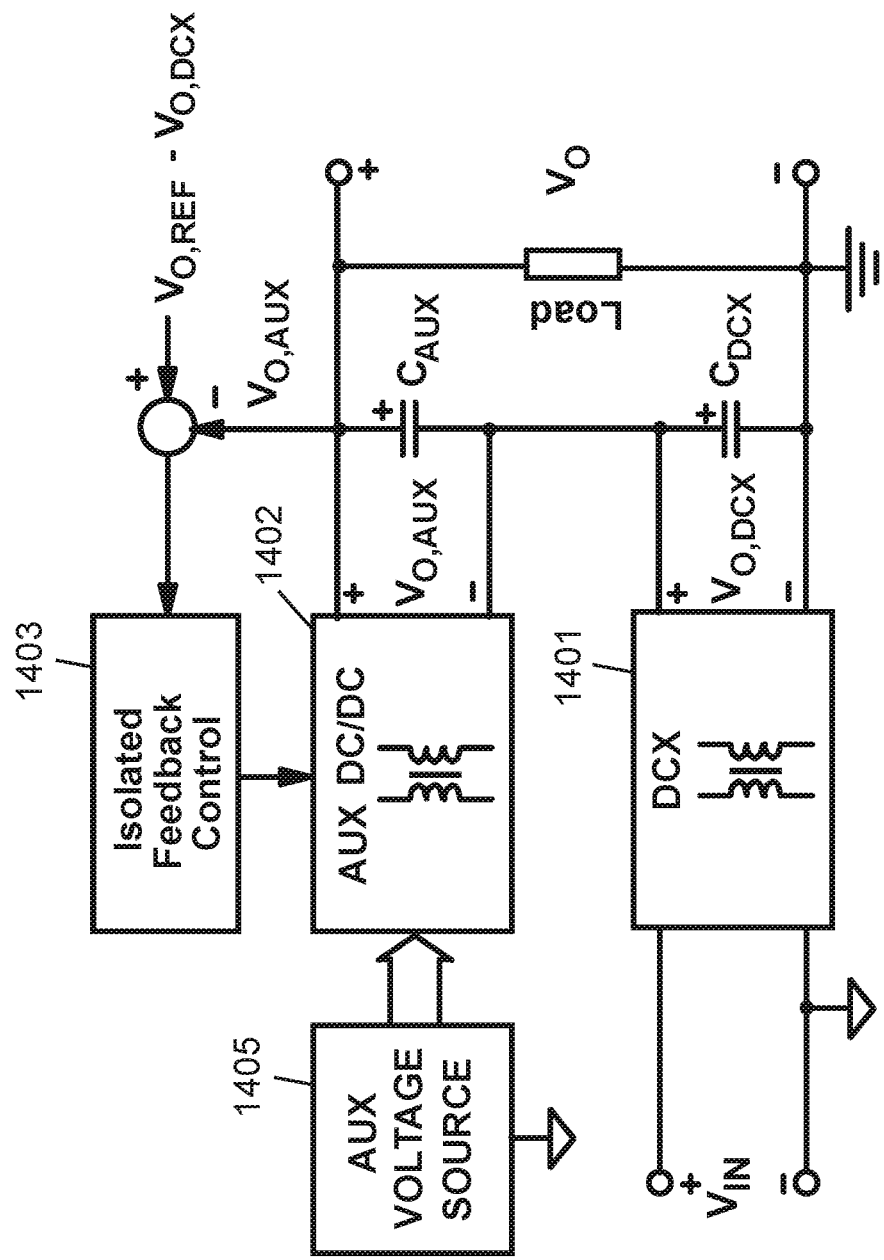
FIG. 14 shows a block diagram of output sigma converter 1400, according to one embodiment of the present invention.

FIG. 14 shows a block diagram of output sigma converter 1400, according to one embodiment of the present invention. Output sigma converter 1400 includes (i) unregulated DCX converter 1401 (e.g., an LLC converter, a series resonant converter (SRC), or a dual-active-bridge (DAB) converter), and (ii) regulated, isolated auxiliary DC/DC converter 1402. In output sigma converter 1400 of FIG. 14, auxiliary DC/DC converter 1402 is fed from auxiliary voltage source 1405 on the input (i.e., input voltage source) side of output sigma converter 1400.

The present invention provides delta converters having two component DC/DC converters and which implement the delta topology on the voltage-source side.

Figure 15:
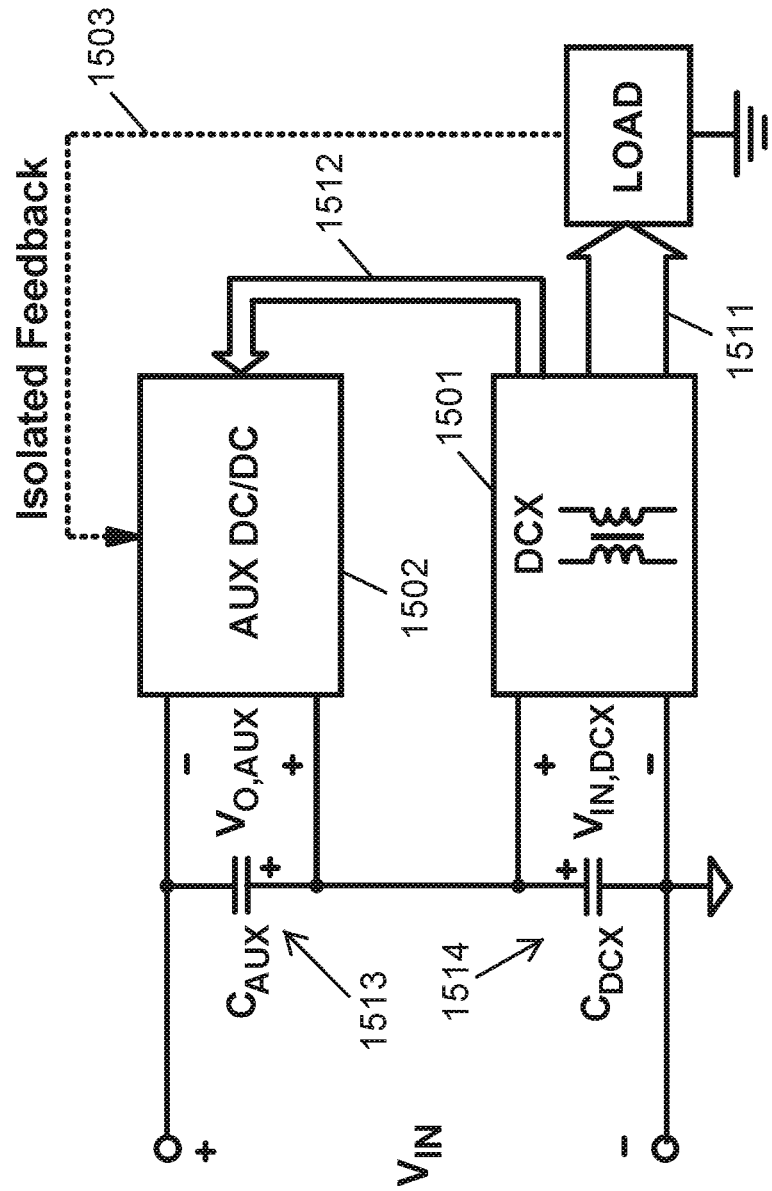
FIG. 15 shows a block diagram of delta converter 1500, according to one embodiment of the present invention.

FIG. 15 shows delta converter 1500, according to one embodiment of the present invention. Delta converter 1500 of FIG. 15 includes (i) unregulated DCX converter 1501 (e.g., an LLC converter, a series resonant converter (SRC), or a dual-active-bridge (DAB) converter); and (ii) regulated auxiliary DC/DC converter 1502. DCX converter 1501 has output ports 1511 and 1512, in which output port 1511 is connected to the load, while output port 1512 ("auxiliary output port") is connected to the input port of auxiliary DC/DC converter 1502. Output port 1513 of auxiliary DC/DC converter 1502, represented by capacitor $C_{AUX}$, is connected in series with input port 1514 of DCX converter 1501 (represented by capacitor $C_{DCX}$), so that voltage difference $V_{IN,DCX} - V_{O,AUX}$ between their respective voltages $V_{IN,DCX}$ and $V_{O,AUX}$ equals to source voltage $V_{IN}$. DCX converter 1501 delivers substantially all the power to the load and, in addition, the input power of auxiliary DC/DC converter 1502. Auxiliary DC/DC converter 1502 may be a non-isolated DC/DC converter (e.g., a buck converter, a boost converter, or a buck-boost converter) operating under PWM modulation to regulate the load voltage. The power handled by auxiliary DC/DC converter 1502 is only a small fraction of the load power. Therefore, delta converter 1500 has very high efficiency. Input voltage $V_{IN,DCX}$ of DCX converter 1501 is substantially constant and higher than the maximum value of source voltage $V_{IN}$ and, as output voltage $V_{O,AUX}$ of Auxiliary DC/DC converter 1502 equals voltage difference $V_{IN,DCX} - V_{IN}$, output voltage $V_{O,AUX}$ of auxiliary DC/DC converter 1502 increases as source voltage $V_{IN}$ decreases. The ratio $P_O/P_{IN,AUX}$ between output power $P_O$ of DCX converter 1501 delivered to the load and output power $P_{IN,AUX}$ of DCX converter 1502 delivered to the input port of auxiliary DC/DC converter 1502 is proportional to the ratio between source voltage $V_{IN}$ and output voltage $V_{O,AUX}$ of auxiliary DC/DC converter 1502 (i.e., $P_O/P_{IN,AUX} \approx V_{IN}/V_{O,AUX}$). Since voltage $V_{O,AUX}$ has a minimum value when source voltage $V_{INT}$ is at its maximum, delta converter 1500 of FIG. 15 has its highest efficiency when source voltage $V_{IN}$ is at its maximum value.

Figure 16:
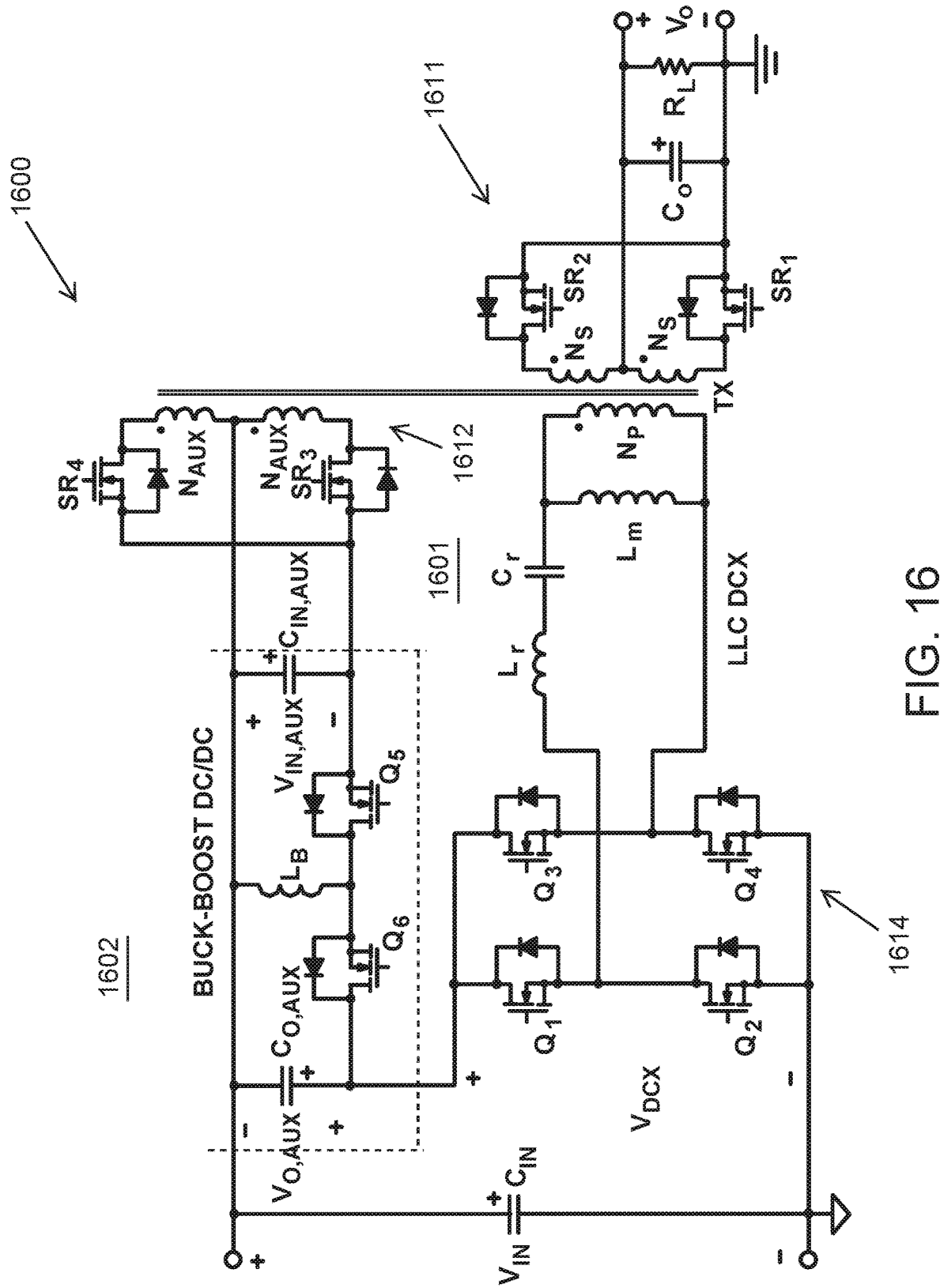
FIG. 16 shows exemplary circuit 1600, which implements delta converter 1500 of FIG. 15, according to one embodiment of the present invention.

FIG. 16 shows exemplary circuit 1600, which implements delta converter 1500 of FIG. 15, according to one embodiment of the present invention. In FIG. 16, DCX converter 1501 is implemented by LLC DCX 1601, which has a full-bridge topology in input port 1614 on the primary side of transformer TX and, on the secondary side of transformer TX, a center-tapped winding and two synchronous rectifiers in each of auxiliary output port 1612 and output port 1611. LLC DCX 1601 may also be implemented with a half-bridge topology at the input port on the primary side of transformer TX and, on the secondary side of transformer TX, a single secondary winding and with a full-bridge rectifier at both output port 1611 and auxiliary output port 1612. Non-isolated auxiliary DC/DC converter 1502 of FIG. 15 is implemented by buck-boost converter 1602 in FIG. 16. Non-isolated auxiliary DC/DC converter 1502 of FIG. 15 can also be implemented by another topology (e.g., a buck topology, or a boost topology).

Figure 17:
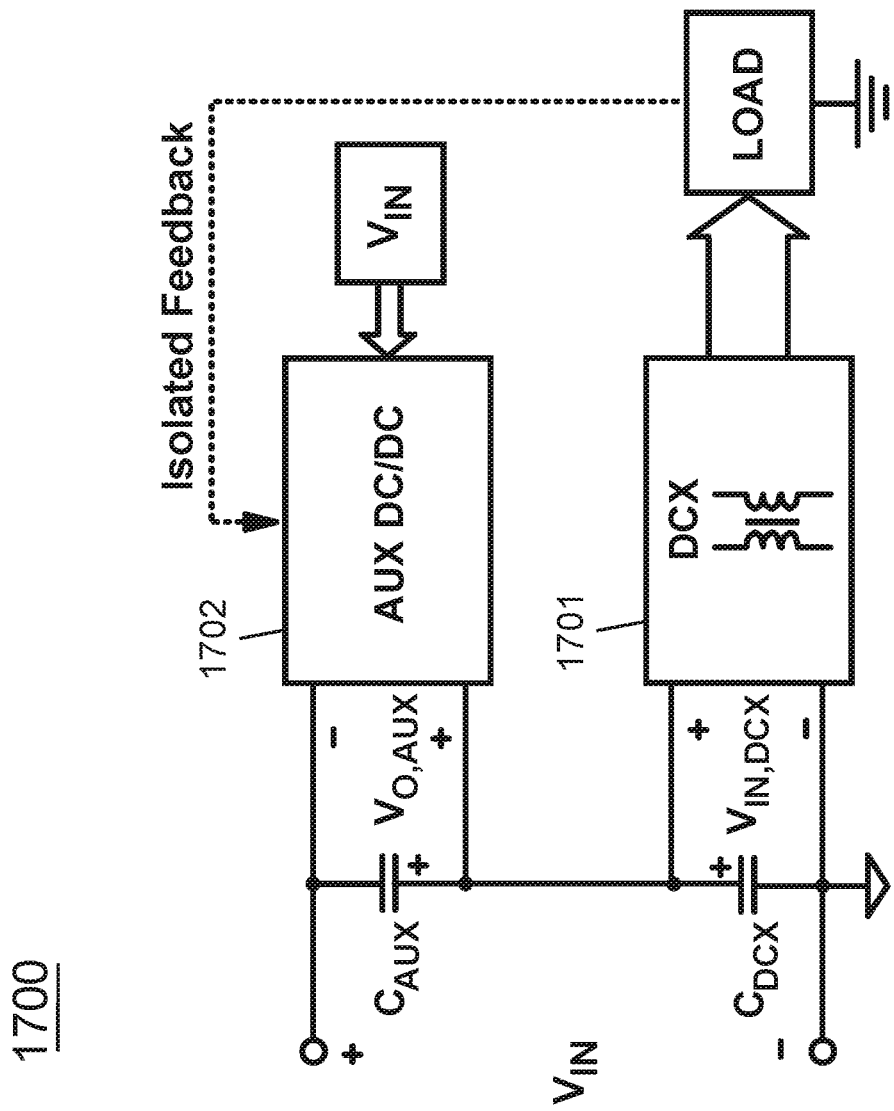
FIG. 17 shows a block diagram of delta converter 1700, according to another embodiment of the present invention.

FIG. 17 shows a block diagram delta converter 1700, according to one embodiment of the present invention. Delta converter 1700 of FIG. 17 includes DCX converter 1701 and auxiliary DC/DC converter 1702. Auxiliary DC/DC converter 1702 receives as input source voltage $V_{IN}$.

Figure 18:
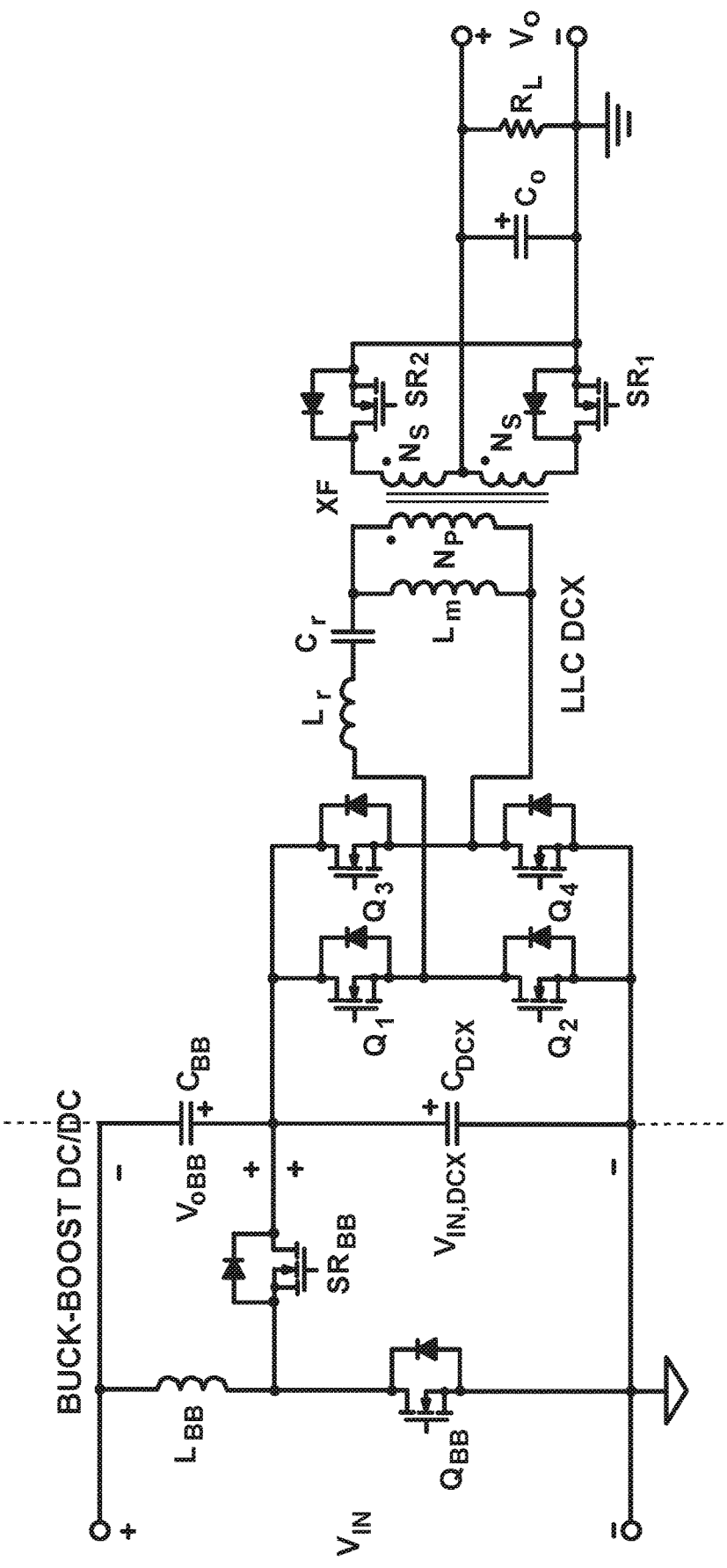
FIG. 18 shows exemplary circuit 1800, which implements delta converter 1700 of FIG. 17, according to one embodiment of the present invention.

FIG. 18 shows exemplary circuit 1800, which implements delta converter 1700 of FIG. 17, according to one embodiment of the present invention. In FIG. 18, DCX converter 1701 is implemented by LLC DCX 1801. The input port on the primary side of transformer XF in LLC DCX 1801 is implemented with a full-bridge topology and the output port on the secondary side of transformer XF in LLC DCX 1801 is implemented with a center-tapped secondary winding and two synchronous rectifiers. The input port on the primary side of transformer XF in LLC DCX 1801 can also be implemented with a half-bridge topology and the output port on the secondary side of transformer XF in LLC DCX 1801 can also be implemented with a single winding and a full-bridge rectifier. Non-isolated auxiliary DC/DC converter 1702 of FIG. 17 is implemented by buck-boost converter 1802 in FIG. 18.

Figure 19:
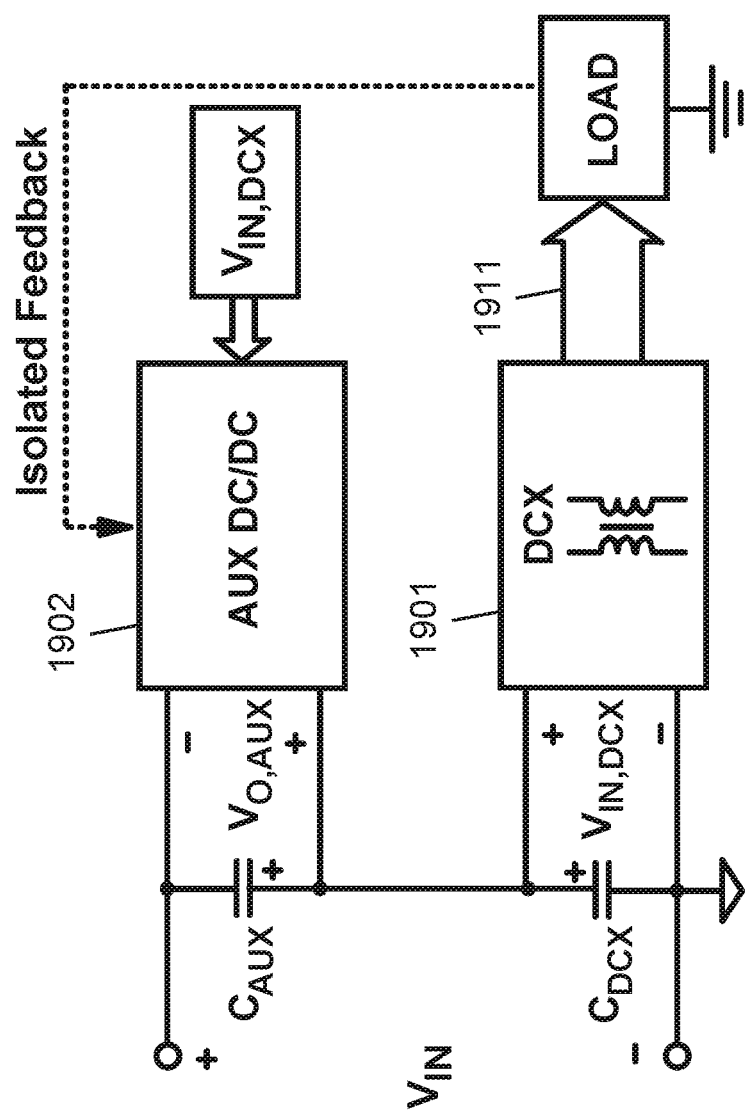
FIG. 19 shows a block diagram of delta converter 1900, according to yet another embodiment of the present invention.

FIG. 19 shows a block diagram of delta converter 1900, according to one embodiment of the present invention. Delta converter 1900 includes DCX converter 1901 and non-isolated auxiliary DC/DC converter 1902. Non-isolated auxiliary DC/DC converter 1902 is fed from input voltage $V_{IN,DCX}$ of DCX converter 1901.

Figure 20:
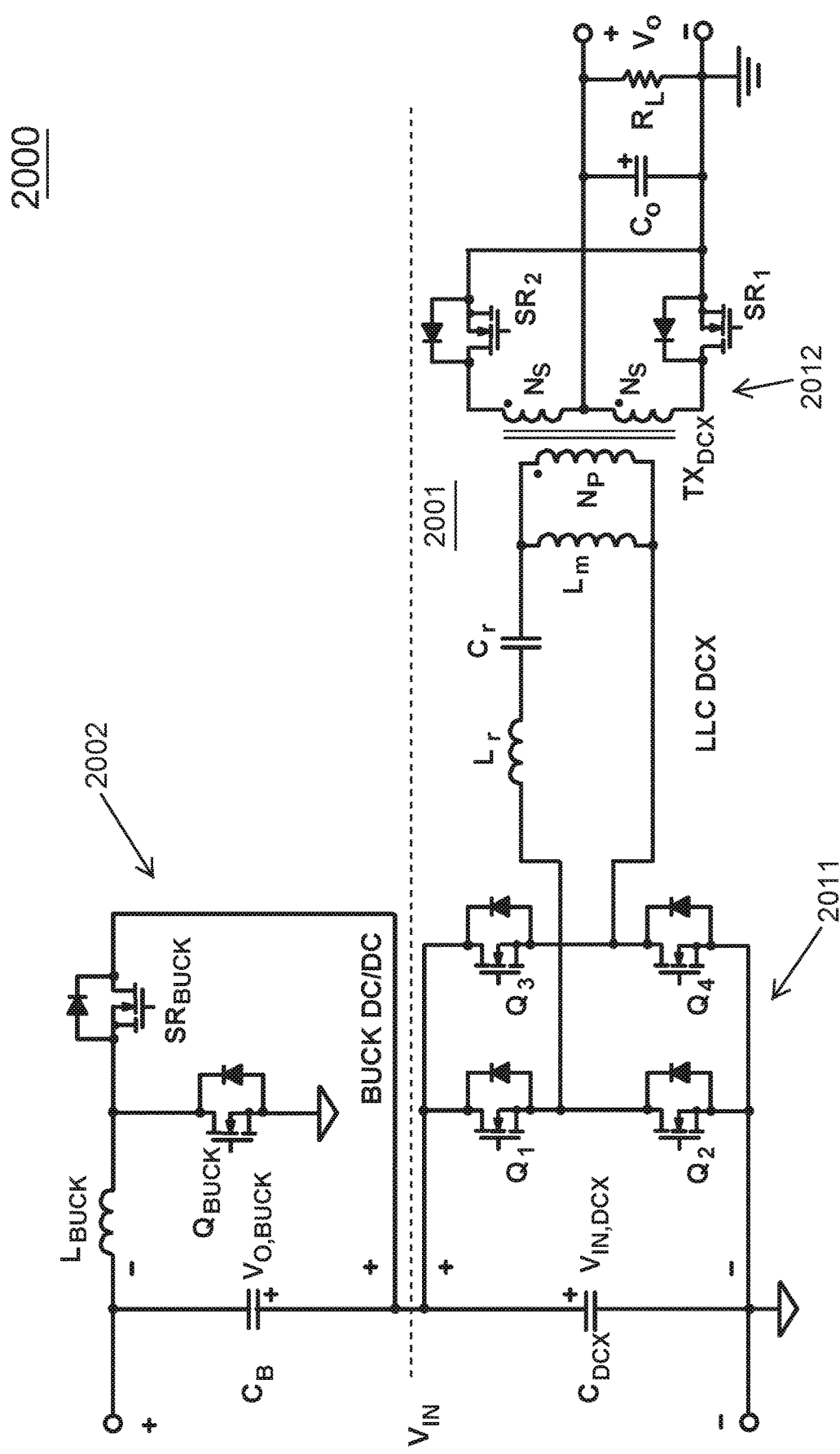
FIG. 20 shows first exemplary circuit 2000, which implements delta converter 1900 of FIG. 19, according to one embodiment of the present invention.
Figure 21:
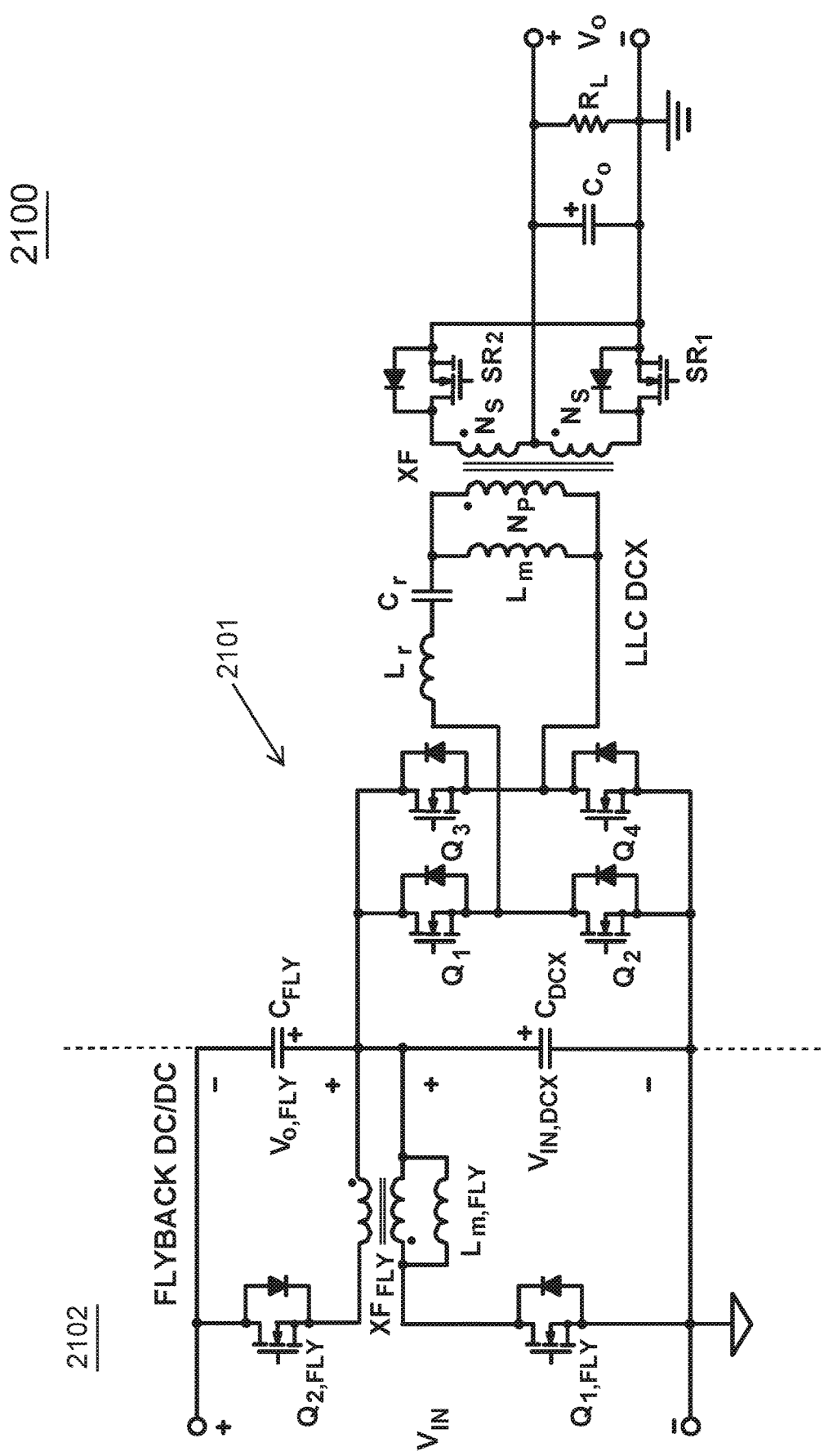
FIG. 21 shows second exemplary circuit 2100, which also implements delta converter 1900 of FIG. 19, according to one embodiment of the present invention.

FIG. 20 shows first exemplary circuit 2000, which implements delta converter 1900 of FIG. 19, according to one embodiment of the present invention. FIG. 21 shows second exemplary circuit 2100, which also implements delta converter 1900 of FIG. 19, according to one embodiment of the present invention. In FIGS. 20 and 21, DCX converter 1900 of FIG. 19 is implemented by LLC DCX 2001 and 2101, respectively. Input port 2011 on the primary side of transformer TX in LLC DCX 2001 is implemented with a full-bridge topology and output port 2012 on the secondary side of transformer TX in LLC DCX 2001 is implemented with a center-tapped secondary winding and two synchronous rectifiers. Input port 2011 on the primary-side in LLC DCX 2001 can also be implemented with a half-bridge topology and output port 2012 on the secondary-side of transformer TX in LLC DCX 2001 can also be implemented with a single secondary winding and a full-bridge rectifier.

Non-isolated auxiliary DC/DC converter 1902 of FIG. 19 is implemented in FIG. 20 by buck converter 2002.

Second exemplary circuit 2100 in FIG. 21 includes LLC DCX 2101, which is configured substantially the same as LLC DCX 2001 of FIG. 20. Non-isolated auxiliary DC/DC converter 1902 of FIG. 19 is implemented in FIG. 20 by non-isolated flyback converter 2102.

Figure 22:
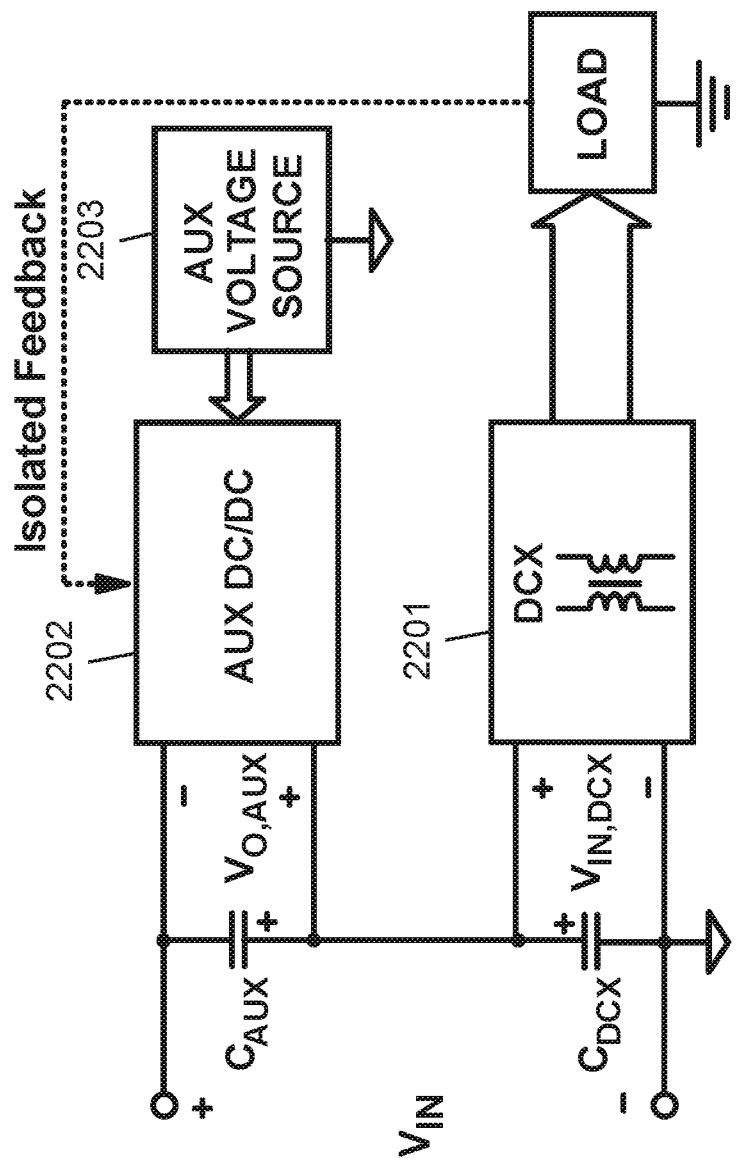
FIG. 22 shows a block diagram of delta converter 2200, according to one embodiment of the present invention.

FIG. 22 shows a block diagram of delta converter 2200, according to one embodiment of the present invention. Delta converter 2200 includes DCX converter 2201 and non-isolated auxiliary DC/DC converter 2202. Auxiliary DC/DC converter 2202 is fed from auxiliary voltage source 2203 on the input (i.e., input voltage source) side of delta converter 2200.

Figure 23:
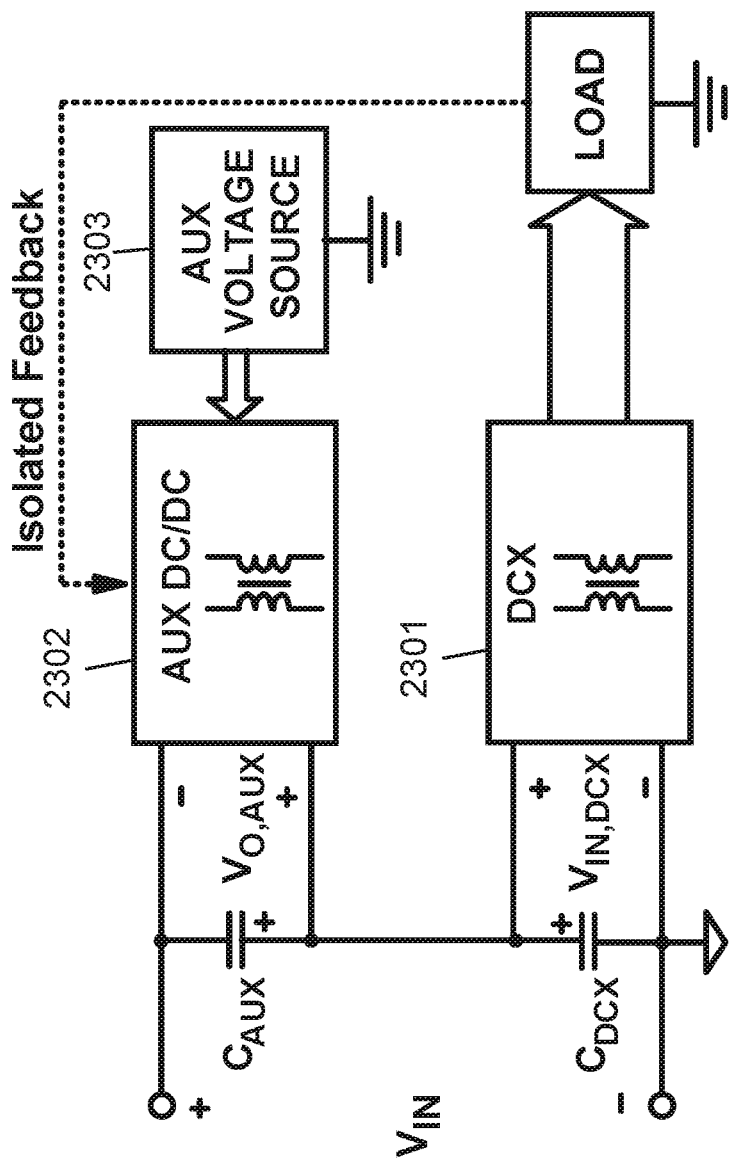
FIG. 23 shows a block diagram of delta converter 2300, according to one embodiment of the present invention.

FIG. 23 shows a block diagram of delta converter 2300, according to one embodiment of the present invention. Delta converter 2300 includes DCX converter 2301 and isolated auxiliary DC/DC converter 2302. Isolated auxiliary DC/DC converter 2302 is fed from auxiliary voltage source 2303 at the load side of the delta converter.

Based on the teachings of the examples above, an input sigma converter has its highest efficiency when the input voltage is at a minimum value, and its efficiency decreases as the input voltage increases. A delta converter, unlike an input sigma converter, has its highest efficiency at its maximum input voltage and its efficiency decreases as the input voltage decreases. Thus, by combining an input sigma converter with a delta converter, the combined sigma-delta converter has a more balanced high efficiency over a wide source voltage range than either the input sigma converter or the delta converter.

Figure 24A:
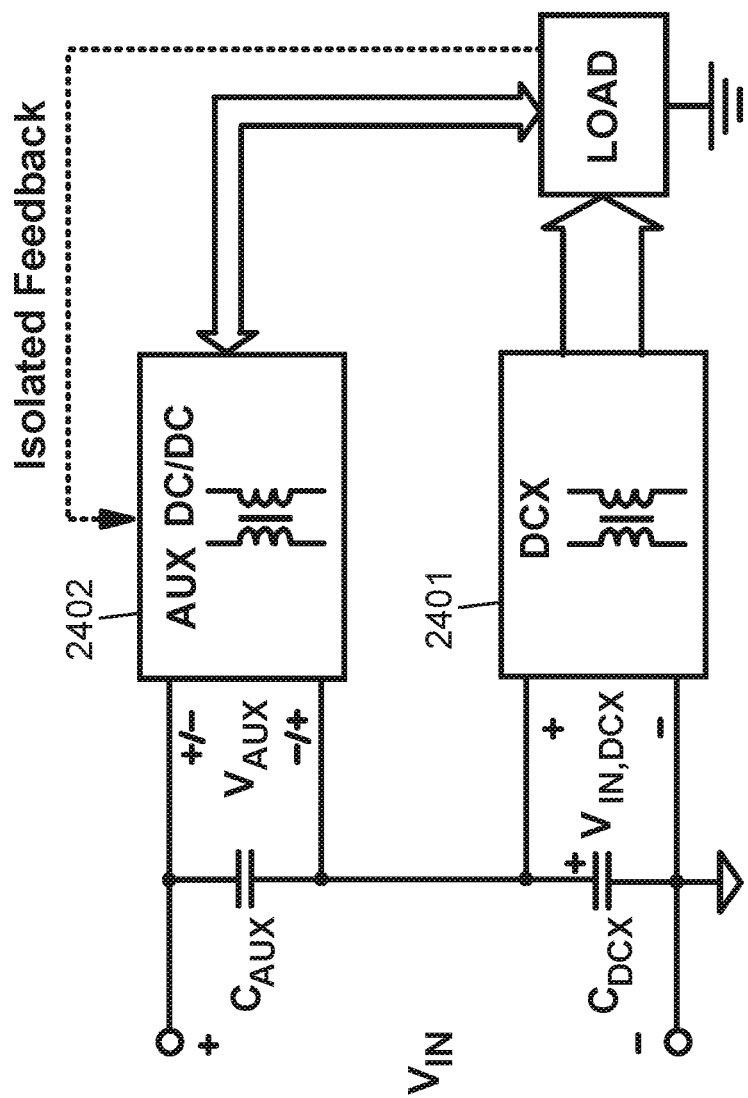
FIG. 24(a) shows a block diagram of sigma-delta converter 2400, according to one embodiment of the present invention.
Figure 24B:
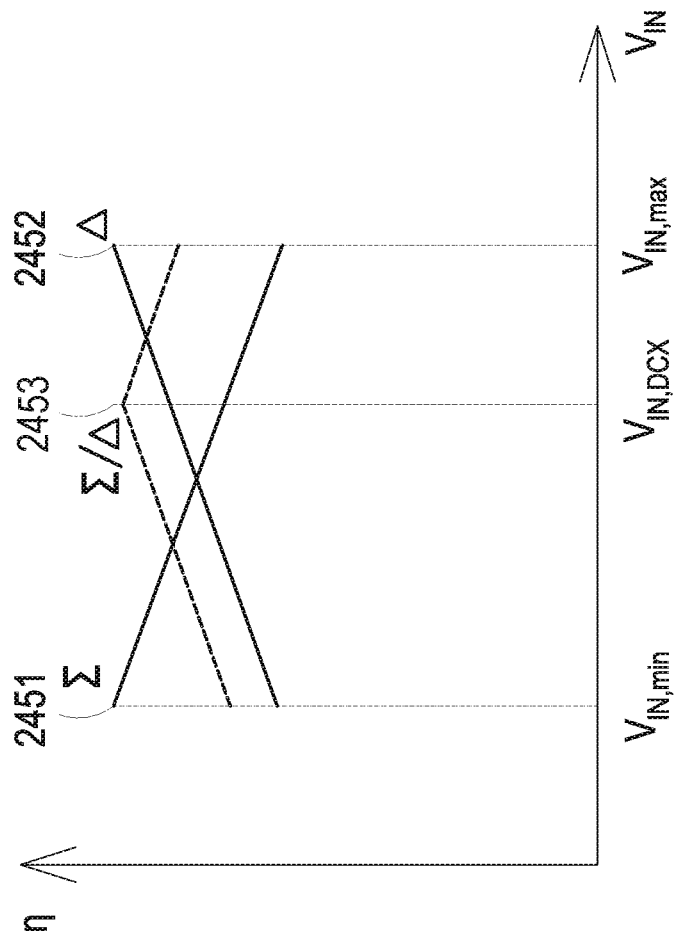
FIG. 24(b) shows the efficiencies of an input sigma converter (e.g., converter 500), of a delta converter (e.g., converter 1500), and of sigma-delta converter 2400 operating between input voltage values $V_{IN,min}$ and $V_{IN,max}$.

FIG. 24(*a*) shows a block diagram of sigma-delta converter 2400, according to one embodiment of the present invention. Sigma-delta converter 2400 includes (i) unregulated isolated DCX converter 2401 (e.g., an LLC converter, a series resonant converter (SRC), or a dual-active-bridge (DAB) converter) and (ii) regulated bidirectional isolated auxiliary DC/DC converter 2402. Note that, voltage $V_{AUX}$ of auxiliary DC/DC converter 2402 on the input source voltage side is bipolar (i.e., $V_{AUX}$ can have a positive value or a negative value).

A sigma-delta converter, such as sigma-delta converter 2400 of FIG. 24(*a*), may operate under either a "sigma" mode or a "delta" mode. Under the sigma mode of operation, the auxiliary DC/DC converter transfers power from the input voltage source to the load, so that the port of the auxiliary DC/DC converter that is connected in series with the input port of the DCX converter is treated as an input port. In that configuration, voltage sum $V_{IN,DCX}+V_{AUX}$ of their respective input voltages equals source voltage $V_{IN}$. At the same time, the output port of the DCX converter and the bidirectional port of the auxiliary DC/DC converter (operating as an output port) are connected in parallel at the load. When the DCX converter operates with transformer isolation, the primary-side switches in the DCX converter operates under a ZVS condition and the secondary-side rectifiers operate under a ZCS condition. Therefore, the DCX converter has very high efficiency. The auxiliary DC/DC converter may operate with PWM modulation to regulate the load voltage. Although the efficiency of the auxiliary DC/DC converter is lower than the efficiency of the DCX converter, as the DCX converter delivers most of the output power, while the auxiliary DC/DC converter delivers only a small portion of the output power, the efficiency of the sigma-delta converter under the sigma mode operation is very high. Under the sigma mode operation, input voltage $V_{IN,DCX}$ of the DCX converter is substantially constant and less than the minimum source voltage and input voltage $V_{AUX}$ of the auxiliary DC/DC converter—which equals voltage difference $V_{AUX}=V_{IN}-V_{IN,DCX}$—increases as source voltage $V_{IN}$ increases. Power is distributed between the DCX converter and the auxiliary DC/DC converter according to the ratio of their input voltages, i.e., $P_{IN,DCX}/P_{IN,AUX}=V_{IN,DCX}/V_{AUX}$, where $P_{IN,DCX}$ and $P_{IN,AUX}$ represent the power transferred over the DCX converter and the auxiliary DC/DC converter, respectively. Since input voltage $V_{AUX}$ of the auxiliary DC/DC converter has a minimum value when source voltage $V_{IN}$ is at a minimum and input voltage $V_{IN,DCX}$ of the DCX converter is substantially constant, the sigma-delta converter under the sigma mode of operation has the highest efficiency when source voltage $V_{IN}$ is at a minimum. In the example given above (i.e., the computer system with a hold-up requirement), the sigma-delta converter may operate under the sigma mode when input voltage $V_{IN}$ is above 300 V.

When a sigma-delta converter operates under the delta mode, the auxiliary DC/DC converter transfers power from the load side to the input voltage source side, so that the port of the auxiliary DC/DC converter that is connected in series with the input port of the DCX converter is treated as an output port. In that configuration, voltage difference $V_{IN,DCX}-V_{AUX}$ between the input port of the DCX converter and the output port of the auxiliary DC/DC converter equals source voltage $V_{IN}$. The output port of the DCX converter and a bidirectional port of auxiliary DC/DC converter (operating as an input port) are connected in parallel at the load. When the DCX converter operates with transformer isolation, the primary-side switches in the DCX converter operates under ZVS conditions and the secondary-side rectifiers operate under ZCS conditions. Therefore, the DCX converter is highly efficient. The auxiliary DC/DC converter operates with PWM modulation to regulate the load voltage. In the delta mode of operation, the DCX converter delivers power to both the load and auxiliary DC/DC converter. Although the efficiency of the auxiliary DC/DC converter is lower than the efficiency of the DCX converter, the power through the auxiliary DC/DC converter is insubstantial relative to the output power at the load. Therefore, the efficiency of the sigma-delta converter under the delta mode operation is still high. As input voltage $V_{IN,DCX}$ of the DCX converter is substantially constant and greater than the maximum value of source voltage $V_{IN}$ and output voltage $V_{AUX}$ of the auxiliary DC/DC converter (which equals voltage difference $V_{AUX}=V_{IN,DCX}-V_{IN}$) increases as source voltage $V_{IN}$ decreases. Power is distributed between the load and the auxiliary DC/DC converter according to the ratio of their input voltages, i.e., $P_O/P_{IN,AUX}=V_{IN}/V_{AUX}$, where $P_O$ and $P_{IN,AUX}$ represent the power transferred over the DCX converter to the load and to the auxiliary DC/DC converter, respectively. Since voltage $V_{AUX}$ has a minimum value when source voltage $V_{IN}$ is at a minimum, the sigma-delta converter under the delta mode operation has its highest efficiency when source voltage $V_{IN}$ is at a maximum value. In the example given above (i.e., the computer system with a hold-up requirement), the sigma-delta converter may operate under the delta mode when input voltage $V_{IN}$ falls below 300 V.

FIG. 24(*b*) shows the efficiencies of an input sigma converter (e.g., converter 500), of a delta converter (e.g., converter 1500), and of sigma-delta converter 2400 operating between input voltage values $V_{IN,min}$ and $V_{IN,max}$. In FIG. 24(*b*), solid line 2451 plots the efficiency of the input sigma converter, solid line 2452 plots the efficiency of the delta converter, and dashed line 2453 plots the efficiency of the sigma-delta converter. Line 2451 shows that the input sigma converter has highest efficiency at minimum input voltage $V_{IN,min}$ and its efficiency decreases with increasing input voltage, so that it has lowest efficiency at maximum input voltage $V_{IN,max}$. Line 2452 shows that the delta converter has highest efficiency and maximum input voltage $V_{IN,min}$ and its efficiency decreases with decreasing input voltage, so that it has lowest efficiency at minimum input voltage $V_{IN,min}$. Line 2453 shows that the sigma-delta converter has highest efficiency at input voltage $V_{IN,DCX}$, which can be, by design, any voltage between $V_{IN,min}$ and $V_{IN,max}$. The sigma-delta converter operates in sigma mode when input voltage $V_{IN}$ is greater than $V_{IN,DCX}$. In sigma mode, it has the highest efficiency at input voltage $V_{IN,DCX}$ and its efficiency decreases with increasing input voltage, so that it has lowest efficiency at maximum input voltage $V_{IN,max}$. The sigma-delta converter operates in delta mode when input voltage $V_{IN}$ is smaller than $V_{IN,DCX}$. In delta mode, it has the highest efficiency at input voltage $V_{IN,DCX}$ and its efficiency decreases with decreasing input voltage, so that it has lowest efficiency at minimum input voltage $V_{IN,min}$. The highest efficiency point of the sigma-delta converter can be optimized depending on the applications.

Figure 25:
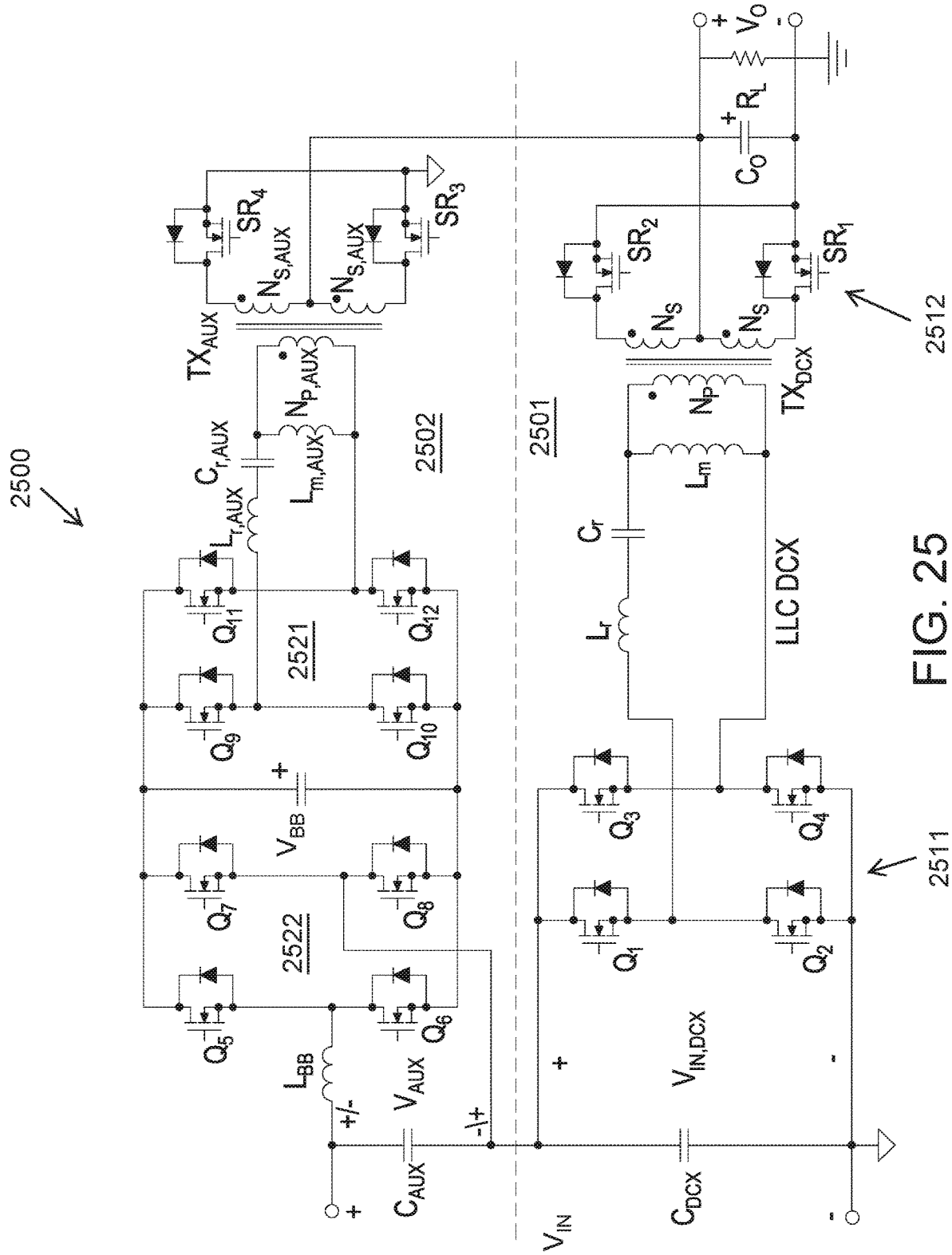
FIG. 25 shows first exemplary circuit 2500, which implements sigma-delta converter 2400 of FIG. 24(a), according to one embodiment of the present invention.

FIG. 25 shows exemplary circuit 2500, which implements sigma-delta converter 2400 of FIG. 24(a), according to one embodiment of the present invention. In FIG. 25, DCX converter 2401 of FIG. 24(a) is implemented in FIG. 25 by LLC DCX 2501. Input port 2511 on the primary side of transformer $TX_{DCX}$ in LLC DCX 2501 is implemented with a full-bridge topology. The secondary side of transformer $TX_{DCX}$ in LLC DCX 2501 is implemented by a center-tapped secondary winding and two synchronous rectifiers. As input voltage $V_{IN,DCX}$ of LLC DCX 2501 is less under the sigma mode of operation than under the delta mode of operation, the primary-side of transformer $TX_{DCX}$ in LLC DCX 2501 is configured as full bridge under the sigma mode of operation, but as a half bridge under the delta mode of operation. Output port 2512 on the secondary side of transformer $TX_{DCX}$ in LLC DCX 2501 can also be implemented with a single secondary winding and with a full-bridge rectifier. Isolated auxiliary DC/DC converter 2402 of FIG. 24(a) is implemented in FIG. 25 by two-stage, isolated bidirectional buck/boost converter 2502. First stage 2522 of isolated bidirectional buck/boost converter 2502 is a non-isolated bidirectional buck/boost converter, which includes inductor $L_{BB}$, buck/boost switches $Q_5$, $Q_6$ and mode-selection switches $Q_7$, $Q_8$. Under the sigma mode of operation, switch $Q_8$ is turned on and $L_{BB}$, $Q_5$, and $Q_6$ operate as a boost converter. However, under the delta mode of operation, switch $Q_7$ is turned on and $L_{BB}$, $Q_5$, and $Q_6$ operate as a buck converter. Second stage 2521 of isolated bidirectional buck/boost converter 2502 is implemented by a bidirectional DC/DC (DCX) converter, which includes primary-side full-bridge topology $Q_9$-$Q_{12}$, the center-tapped secondary winding of $TX_{AUX}$ and two synchronous rectifiers. Under the sigma mode of operation, switches $Q_9$-$Q_{12}$ convert link voltage $V_{BB}$ to a rectangular bipolar voltage with a 50% duty cycle, while under the delta mode of operation, switches $Q_9$-$Q_{12}$ operate as synchronous rectifies. Note that, the secondary-side of transformer $TX_{AUX}$ in the DCX converter can also be implemented by a single secondary winding and with a full-bridge rectifier.

Figure 26:
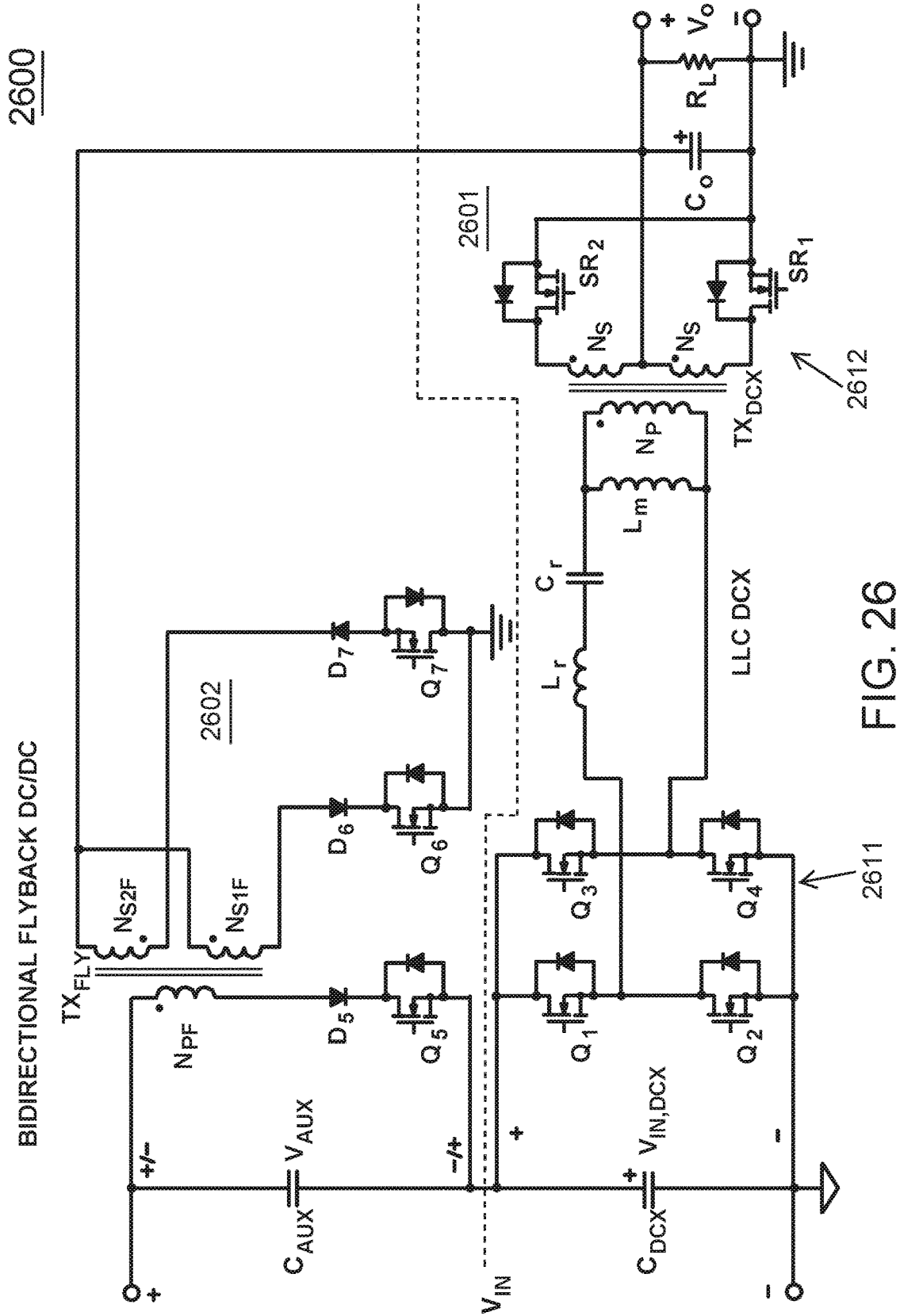
FIG. 26 shows second exemplary circuit 2600, which also implements sigma-delta converter 2400 of FIG. 24(a), according to one embodiment of the present invention.

FIG. 26 shows second exemplary circuit 2600, which also implements sigma-delta converter 2400 of FIG. 24(a), according to one embodiment of the present invention. In FIG. 26, DCX converter 2401 of FIG. 24(a) is implemented by LLC DCX 2601, which is substantially the same as LLC DCX 2501 of FIG. 25. Auxiliary DC/DC converter 2402 of FIG. 24(a) is implemented in sigma-delta converter 2600 by isolated bidirectional auxiliary DC/DC flyback converter 2602. Under the sigma mode of operation, when transistor $Q_7$ is conducting, a portion of the load power is transferred from the voltage-source side to the load through secondary winding $N_{S2F}$ of transformer $TX_{FLY}$ in auxiliary flyback converter 2602. In the delta mode of operation, when transistor $Q_6$ is conducting, a portion of the output power of LLC DCX 2601 is transferred back to the voltage-source side through secondary winding $N_{S1F}$ of transformer $TX_{FLY}$.

Figure 27:
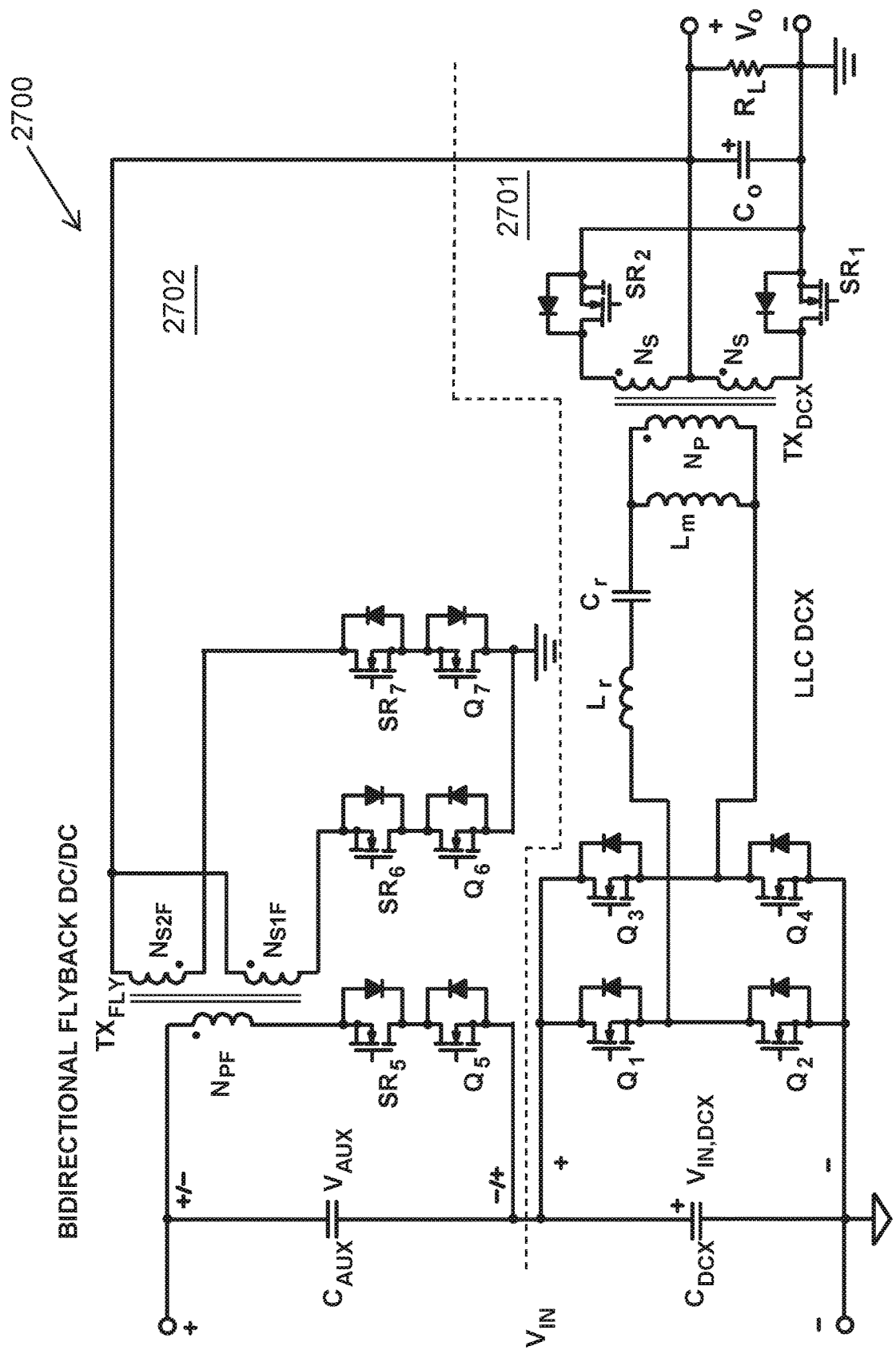
FIG. 27 shows third exemplary circuit 2700, which also implements sigma-delta converter 2400 of FIG. 24(a), according to one embodiment of the present invention.

FIG. 27 shows third exemplary circuit 2700, which also implements sigma-delta converter 2400 of FIG. 24(a), according to one embodiment of the present invention. In FIG. 27, DCX converter 2401 is implemented by LLC DCX 2701, which is substantially the same as LLC DCX 2601 of FIG. 26. In FIG. 27, auxiliary DC/DC converter 2402 of FIG. 24(a) is implemented by isolated flyback converter 2702, which may be substantially the same as isolated flyback converter 2602 of FIG. 26, except that diode rectifiers $D_5$, $D_6$, and $D_7$ in flyback converter 2602 are implemented by synchronous rectifiers $SR_5$, $SR_6$, and $SR_7$ in flyback converter 2702.

In the exemplary circuits 2500 and 2600 of FIGS. 25 and 26, input voltage $V_{IN,DCX}$ of LLC DCX 2501 and 2601 under the sigma mode of operation is less than under the delta mode of operation, Thus, input ports 2511 and 2611 on the primary-side of transformers $TX_{DCX}$ under the sigma mode of operation each have a full-bridge configuration. Under the delta mode of operation, however, input ports 2511 and 2611 may each be configured to have a half-bridge configuration. According to another embodiment of the present invention, when the input voltage of an LLC DCX is the same for both the sigma mode and the delta mode of operation, the input port on the primary-side of the transformer in the LLC DCX may have either a full-bridge configuration or a half-bridge configuration. (Note that, when input voltage $V_{IN}$ is greater than input voltage $V_{IN,DCX}$ of the LLC DCX, the sigma-delta converter operates under the sigma mode. Conversely, when input voltage $V_{IN}$ is less than input voltage $V_{IN,DCX}$ of the LLC DCX, the sigma-delta converter operates in the delta mode.) When the sigma-delta converter operates with different values of input voltage $V_{IN,DCX}$ under the sigma and the delta modes of operation, there are two maximum efficiency points: at $V_{INmin}$ and at $V_{INmax}$, respectively. However, when the sigma-delta converter operates with the same value of $V_{IN,DCX}$ under the sigma and the delta modes of operation, only one maximum efficiency point exists (i.e., at $V_{IN}=V_{IN,DCX}$), which can be beneficious in some applications.

Figure 28:
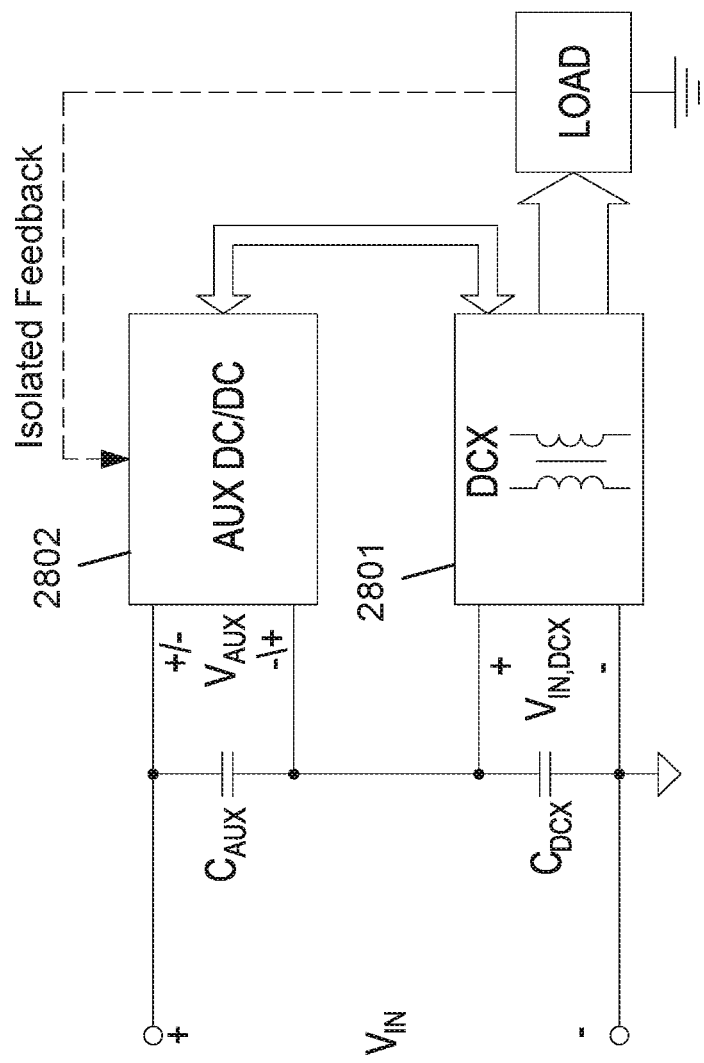
FIG. 28 shows a block diagram of sigma-delta converter 2800, according to one embodiment of the present invention.
Figure 29:
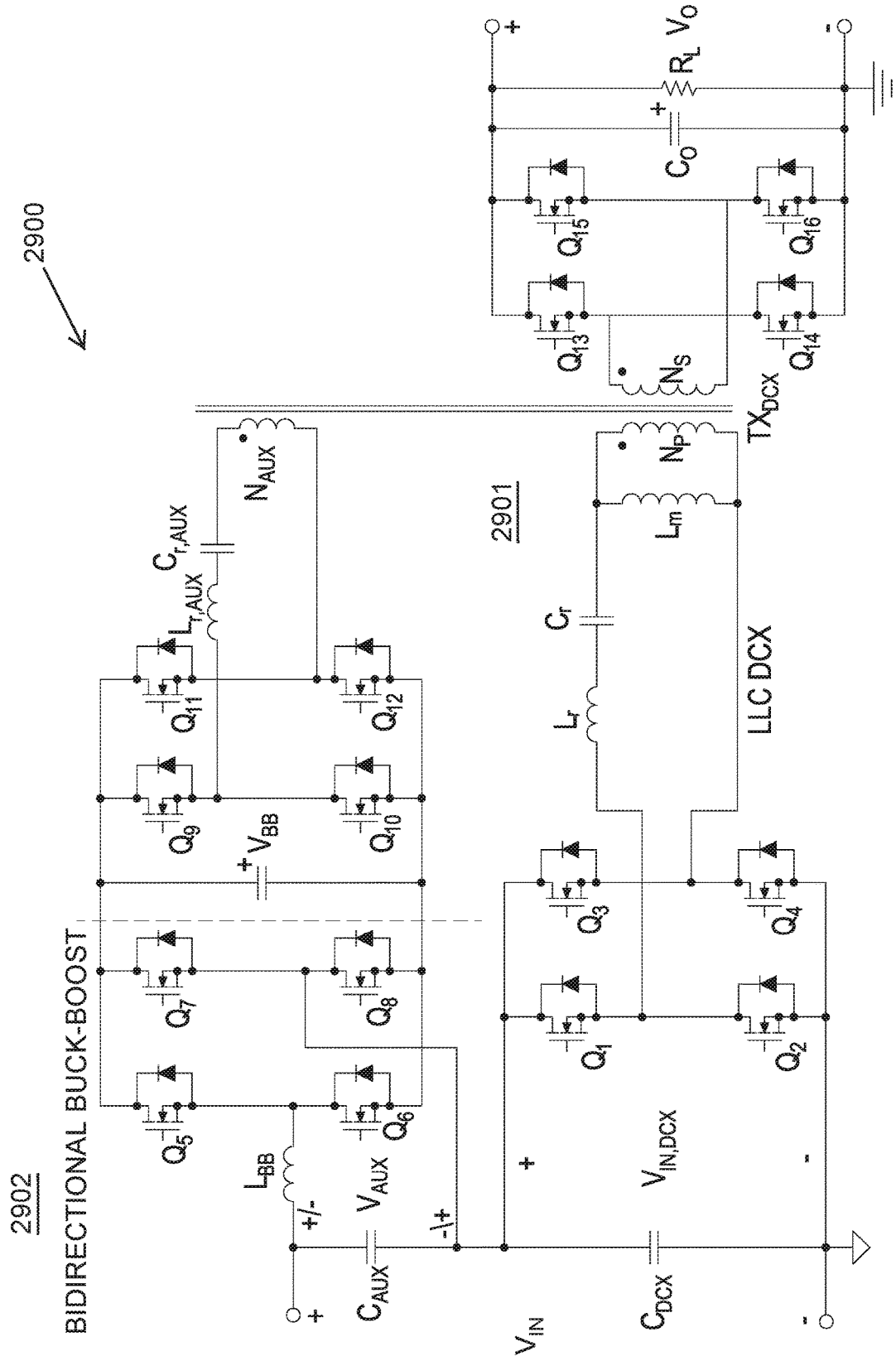
FIG. 29 shows exemplary circuit 2900, which implements sigma-delta converter 2800 of FIG. 28, according to one embodiment of the present invention.

FIG. 28 shows a block diagram of sigma-delta converter 2800, according to one embodiment of the present invention. Unlike sigma-delta converter 2400 of FIG. 24(a), sigma-delta converter 2800 of FIG. 28 includes non-isolated auxiliary bidirectional DC/DC converter 2802. FIG. 29 shows exemplary circuit 2900, which implements sigma-delta converter 2800 of FIG. 28. Sigma-delta converter 2900 includes LLC DCX 2901 and non-isolated buck-boost converter 2902, according to one embodiment of the present invention. As shown in FIG. 29, under the sigma mode of operation, transistor $Q_8$ is conducting. Under the delta mode of operation, transistor $Q_7$ is conducting.

Figure 30:
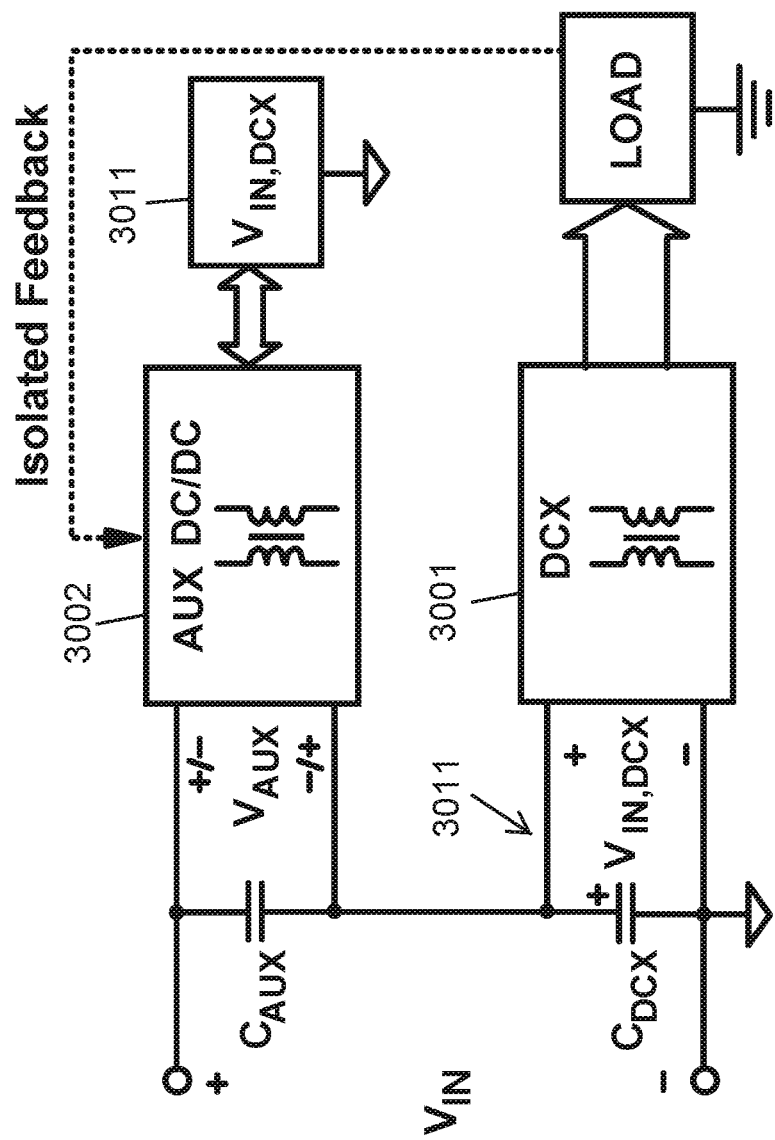
FIG. 30 shows a block diagram of sigma-delta converter 3000, according to one embodiment of the present invention.
Figure 31:
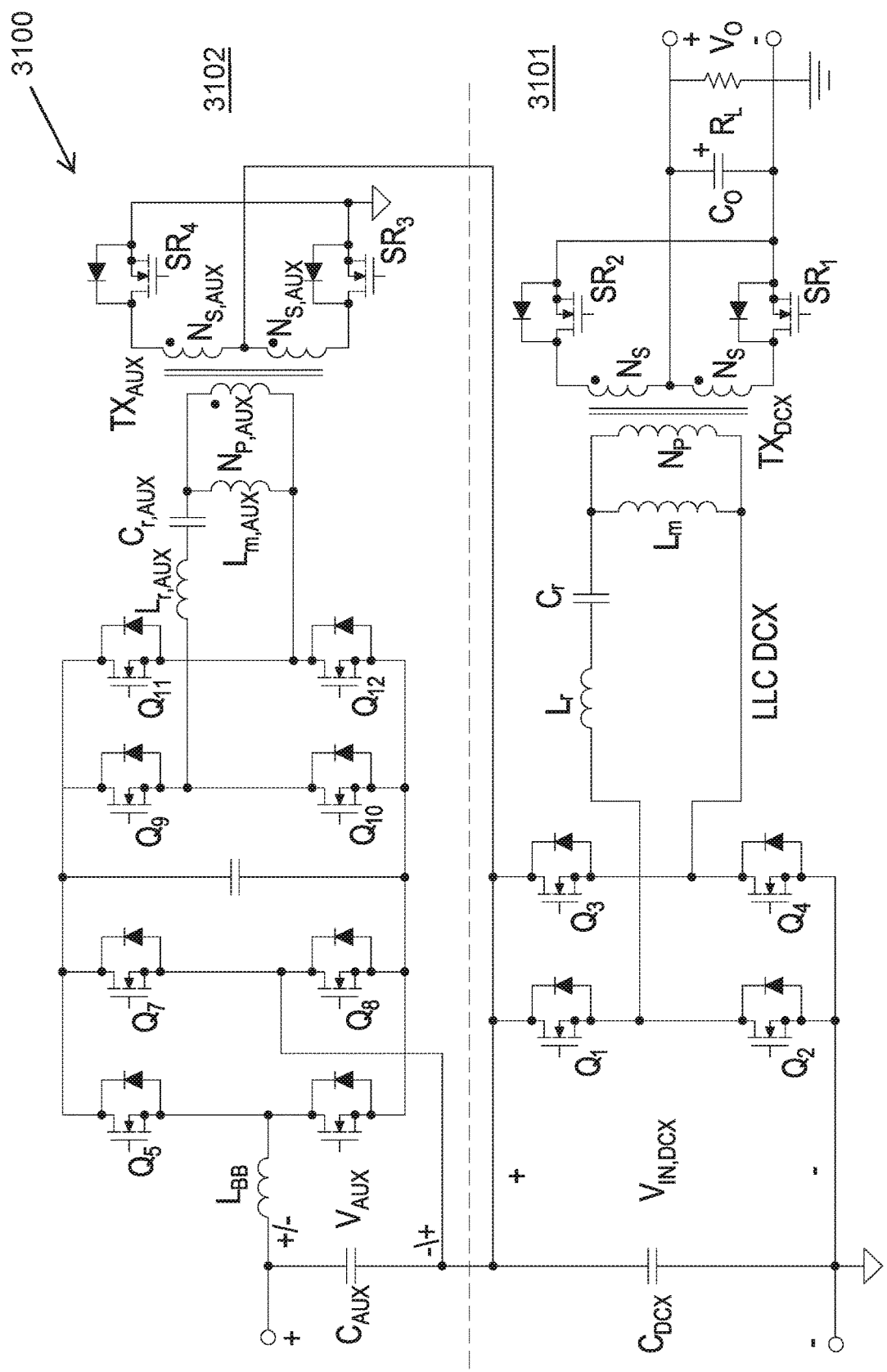
FIG. 31 shows first exemplary circuit 3100, which implements sigma-delta converter 3000 of FIG. 30, according to one embodiment of the present invention.
Figure 32:
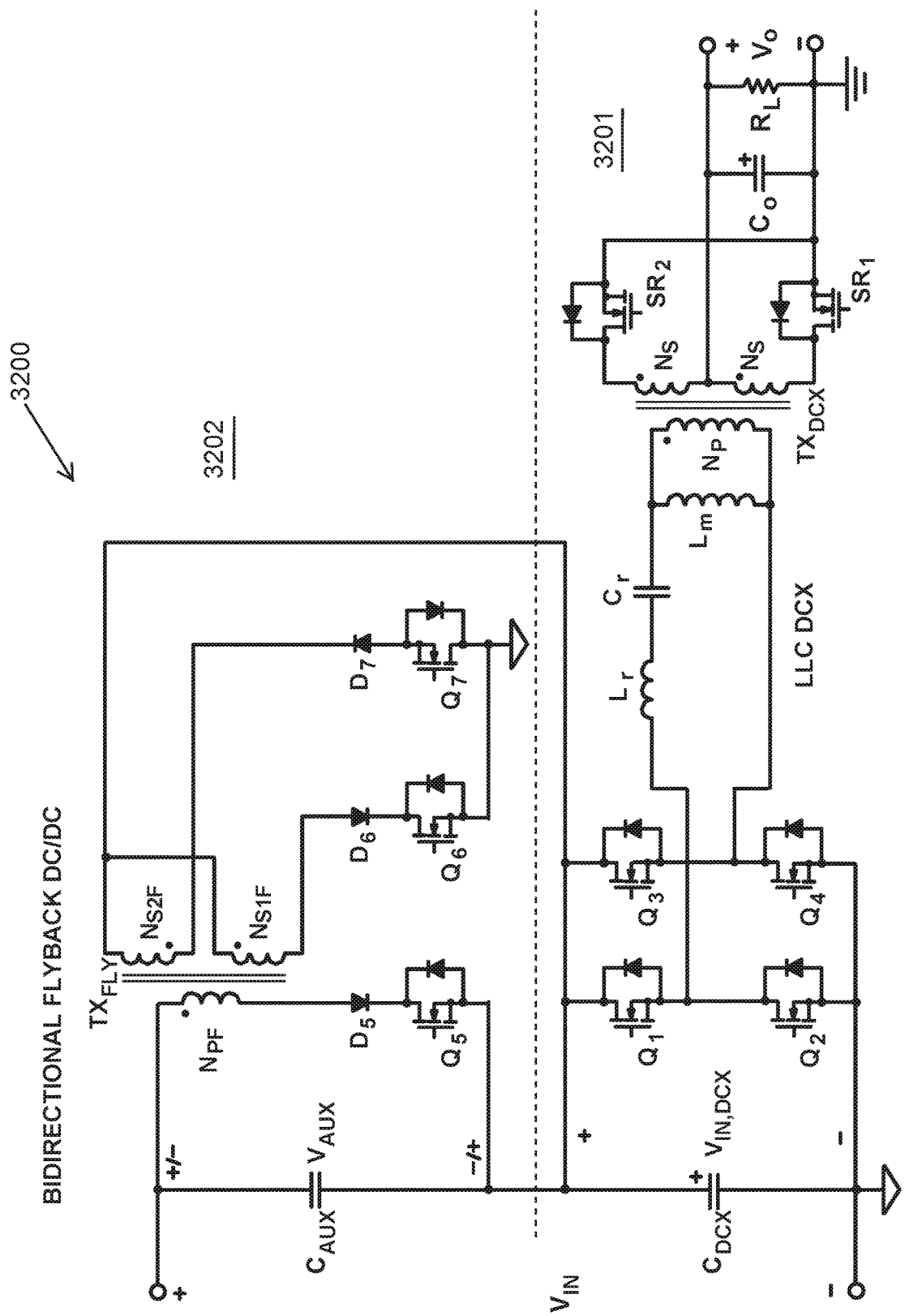
FIG. 32 shows second exemplary circuit 3200, which also implements sigma-delta converter 3000 of FIG. 30, according to one embodiment of the present invention.
Figure 33:
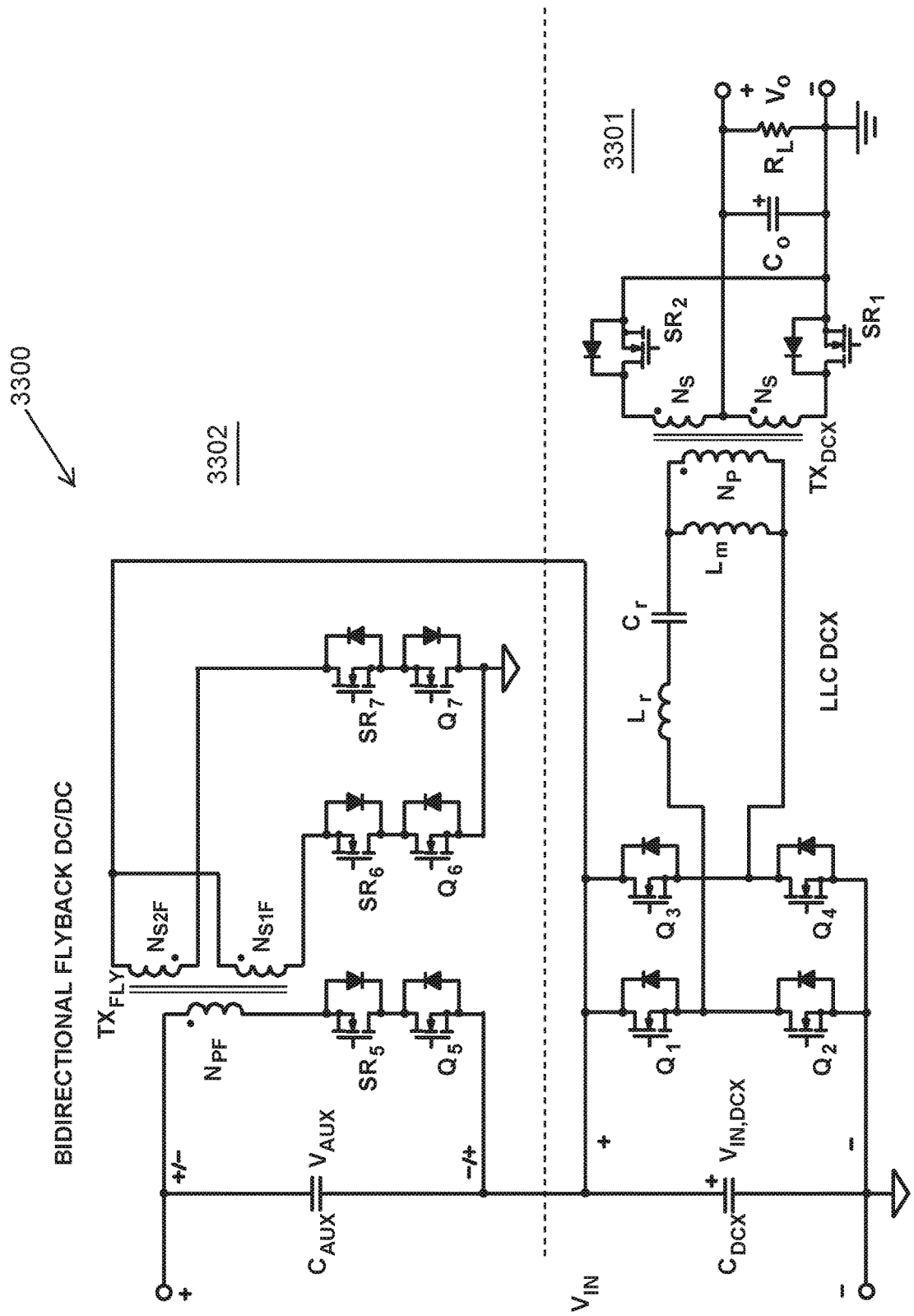
FIG. 33 shows third exemplary circuit 3300, which also implements sigma-delta converter 3000 of FIG. 30, according to one embodiment of the present invention.

FIG. 30 shows a block diagram of sigma-delta converter 3000, according to one embodiment of the present invention. Sigma-delta converter 3000 includes DCX converter 3001 and auxiliary DC/DC converter 3002. Unlike in sigma-delta converter 2400 of FIG. 24(a), in sigma-delta converter 3000 of FIG. 30, the load terminal of auxiliary bidirectional DC/DC converter 3002 is connected to input terminal 3011 of DCX converter 3001. FIGS. 31, 32 and 33 show, respectively, first, second, and third exemplary circuits 3100, 3200 and 3300, each implementing sigma-delta converter 3000 of FIG. 30, according to one embodiment of the present invention. Circuit 3100 includes LLC DCX 3101 and isolated buck-boost converter 3102, implementing DCX converter 3001 and auxiliary DC/DC converter 3002 of FIG. 30, respectively. Circuit 3200 includes LLC DCX 3201 and isolated flyback converter 3202, implementing DCX converter 3001 and auxiliary DC/DC converter 3002 of FIG. 30, respectively. Circuit 3300 includes LLC DCX 3301 and non-isolated flyback converter 3302, implementing DCX converter 3001 and auxiliary DC/DC converter 3002 of FIG. 30, respectively.

The above detailed description is provided to illustrate specific embodiments of the present invention and is not intended to be limiting. Numerous modifications and variations within the scope of the present invention are possible. The present invention is set forth in the accompanying claims.

The invention claimed is:

1. A converter receiving a source voltage from a voltage source and providing an output voltage across a load, the converter comprising:
   a first DC/DC converter having an input port and first and second output ports; and
   a second DC/DC converter having an input port and an output port and receiving a control signal derived from the output voltage; and
   wherein (i) the input ports of the first and the second DC/DC converters are connected in series across the voltage source, configured such that the voltage across the input port of the first DC/DC converter is less than the source voltage; (ii) the first output port of the first DC/DC converter providing the output voltage; (iii) the second output port of the first DC/DC converter and the output port of the second DC/DC converter are connected in parallel, and (iv) the second DC/DC converter regulates the output voltage based on the control signal.

2. The converter of claim 1, wherein the second DC/DC converter comprises a boost converter.

3. The converter of claim 2, wherein the boost converter is non-isolated.

4. The converter of claim 2, wherein the first DC/DC converter is isolated by a transformer.

5. The converter of claim 1, wherein the first DC/DC converter comprises LLC resonant converter.

6. The converter of claim 1, wherein the first DC/DC converter further comprises a plurality of switches organized in a full-bridge configuration.

7. A converter receiving a source voltage from a voltage source and providing an output voltage across a load, the converter comprising:
   a first DC/DC converter having an input port receiving the source voltage across the voltage source and an output port; and
   a second DC/DC converter having an input port and an output port and receiving a control signal derived from the output voltage; and
   wherein (i) the output ports of the first and the second DC/DC converters are connected in series to provide the output voltage across the load, configured such that the voltage across the output port of the first DC/DC converter is less than the load voltage; and (ii) the second DC/DC converter regulates the output voltage based on the control signal.

8. The converter of claim 7, wherein the input ports of the first and the second DC/DC converters are connected in parallel, each receiving the source voltage.

9. The converter of claim 8, wherein the second DC/DC converter comprises a flyback converter.

10. The converter of claim 7, wherein the input port of the second DC/DC converter and the output port of the first DC/DC converter are connected in parallel.

11. The converter of claim 10, wherein the second DC/DC converter comprises a buck-boost converter.

12. The converter of claim 7, wherein the first DC/DC converter further comprises a second output port, and wherein the input port of the second DC/DC converter and the second output port of the first DC/DC converter are connected in parallel.

13. The converter of claim 12, wherein the first DC/DC converter comprises an isolating transformer.

14. The converter of claim 12, wherein the second DC/DC converter comprises a buck converter.

15. The converter of claim 14, wherein the buck converter is non-isolated.

16. The converter of claim 7, further comprising a second voltage source and wherein the input port of the second DC/DC converter is connected across the second voltage source.

17. The converter of claim 16, wherein the first DC/DC converter comprises an isolated DC/DC converter.

18. The converter of claim 7, wherein the first DC/DC converter comprises an LLC resonant converter.

19. The converter of claim 7, wherein the first DC/DC converter further comprises a plurality of switches organized in a full-bridge configuration.

20. The converter of claim 7, wherein the first DC/DC converter further comprises an isolating transformer.

21. A converter receiving a source voltage from a voltage source and providing an output voltage across a load, the converter comprising:
   a first DC/DC converter having an input port and an output port, the output port being connected across the load; and
   a second DC/DC converter having an input port and an output port and receiving a control signal derived from the output voltage; and
   wherein (i) the input port of the first DC/DC converter and the output port of the second DC/DC converter are connected in series across the voltage source, configured such that the voltage across the input port of the first DC/DC converter is greater than the source voltage; (ii) the second DC/DC converter regulates the output voltage based on the control signal and (iii) the voltage source and the first DC/DC converter are referenced to a common ground voltage.

22. The converter of claim 21, wherein the first DC/DC converter comprises an LLC resonant converter.

23. The converter of claim 21, wherein the input port of the first DC/DC converter further comprises a plurality of switches organized in a full-bridge configuration.

24. The converter of claim 21, wherein the first DC/DC converter comprises an isolating transformer.

25. The converter of claim 21, wherein the second DC/DC converter comprises a buck-boost converter.

26. The converter of claim 25, wherein the buck-boost converter is non-isolated.

27. The converter of claim 21, wherein the first DC/DC converter further comprises a second output and wherein the second output port of the first DC/DC converter and the input port of the second DC/DC converter are connected in parallel.

28. The converter of claim 21, wherein the input port of the second DC/DC converter is connected across the voltage source.

29. The converter of claim 21, wherein the input ports of the first and the second DC/DC converters are connected in parallel.

30. The converter of claim 29, wherein the second DC/DC converter comprises a buck converter.

31. The converter of claim 30, wherein the second DC/DC converter comprises a flyback converter.

32. The converter of claim 31, wherein the second DC/DC converter is non-isolated.

33. The converter of claim 21, wherein the input port of the second DC/DC converter is connected across a second voltage source.

34. The converter of claim 33, wherein the second DC/DC converter is non-isolated.

35. A converter receiving a source voltage from a voltage source and providing an output voltage across a load, the converter comprising:
a first DC/DC converter having an input port and an output port; and
a second DC/DC converter having a first input/output port and a second input/output port, wherein the second DC/DC converter is bidirectional and receives a control signal that is derived from the output voltage; and
wherein (i) the input port of the first DC/DC converter and the first input/output port of the second DC/DC converter are connected in series across the voltage source; and (ii) only the second DC/DC converter regulates the output voltage based on the control signal.

36. The converter of claim 35, wherein the first DC/DC converter comprises an LLC resonant converter.

37. The converter of claim 35, wherein the first DC/DC converter further comprises a plurality of switches organized in a full-bridge configuration.

38. The converter of claim 35, wherein the first DC/DC converter comprises an isolating transformer.

39. The converter of claim 35, wherein the second DC/DC converter further comprises one or more switches for configuring the converter to operate with either a voltage across the input port of the first DC/DC converter being less than the source voltage, or the voltage across the input port of the first DC/DC converter being greater than the source voltage.

40. The converter of claim 35, wherein the second input/output port of the second DC/DC converter is connected across the load.

41. The converter of claim 40, wherein the second DC/DC converter comprises a buck-boost converter.

42. The converter of claim 40, wherein the second DC/DC converter comprises a flyback converter.

43. The converter of claim 40, wherein the second DC/DC converter comprises an isolation transformer.

44. The converter of claim 43, wherein the second input/output port comprises a center-tapped winding, a plurality of switches and a plurality of diodes or synchronous rectifiers, the switches and the diodes or synchronous rectifiers being organized in a full-bridge configuration.

45. The converter of claim 35, wherein the first DC/DC converter further comprises a second output port and wherein the second output port of the first DC/DC converter and the second input/output port of the second DC/DC converter are connected in parallel.

46. The converter of claim 45, wherein the second DC/DC converter comprises a buck-boost converter.

47. The converter of claim 46, wherein the second input/output port comprises a plurality of switches organized in a full-bridge configuration.

48. The converter of claim 35, wherein the input port of the first DC/DC converter and the second input/output port of the second DC/DC converter are connected in parallel.

49. The converter of claim 48, wherein the second DC/DC converter comprises an isolating transformer.

50. The converter of claim 48, wherein the second DC/DC converter comprises a buck-boost converter.

51. The converter of claim 48, wherein the second DC/DC converter comprises a flyback converter.

52. The converter of claim 51, wherein the second input/output port comprises a center-tapped winding, a plurality of switches and a plurality of diodes or synchronous rectifiers, the switches and the diodes or synchronous rectifiers being organized in a full-bridge configuration.

* * * * *